(12) United States Patent
Mori et al.

(10) Patent No.: US 11,362,686 B2
(45) Date of Patent: Jun. 14, 2022

(54) MULTIPLEXER AND COMMUNICATION DEVICE

(71) Applicant: MURATA MANUFACTURING CO., LTD., Kyoto (JP)

(72) Inventors: Hirotsugu Mori, Nagaokakyo (JP); Hidenori Obiya, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 198 days.

(21) Appl. No.: 16/896,649

(22) Filed: Jun. 9, 2020

(65) Prior Publication Data

US 2020/0395960 A1 Dec. 17, 2020

(30) Foreign Application Priority Data

Jun. 14, 2019 (JP) .............................. JP2019-111022

(51) Int. Cl.
*H04B 1/00* (2006.01)
*H03H 9/05* (2006.01)
*H03H 9/64* (2006.01)
*H03H 9/72* (2006.01)
*H04B 1/18* (2006.01)

(52) U.S. Cl.
CPC .......... *H04B 1/0057* (2013.01); *H03H 9/0576* (2013.01); *H03H 9/6483* (2013.01); *H03H 9/725* (2013.01); *H04B 1/006* (2013.01); *H04B 1/18* (2013.01)

(58) Field of Classification Search
CPC ........ H04B 1/18; H04B 1/006; H04B 1/0057; H03H 9/0576; H03H 9/6483; H03H 7/725

See application file for complete search history.

(56) References Cited

U.S. PATENT DOCUMENTS

2018/0034152 A1 2/2018 Mura et al.

OTHER PUBLICATIONS

3GPP TSG-RAN WG4 Meeting 90, R4-1901356, Athens, Greece, Feb. 25-Mar. 1, 2019.

*Primary Examiner* — Stephen E. Jones
*Assistant Examiner* — Kimberly E Glenn
(74) *Attorney, Agent, or Firm* — Pearne & Gordon LLP

(57) ABSTRACT

A multiplexer includes a common terminal, a first filter configured to be connected to the common terminal, and having a first passband, a second filter configured to be connected to the common terminal, and having a second passband that at least partially overlaps the first passband, and a third filter configured to be connected to the common terminal, and having a third passband that does not overlap both the first passband and the second passband.

15 Claims, 26 Drawing Sheets

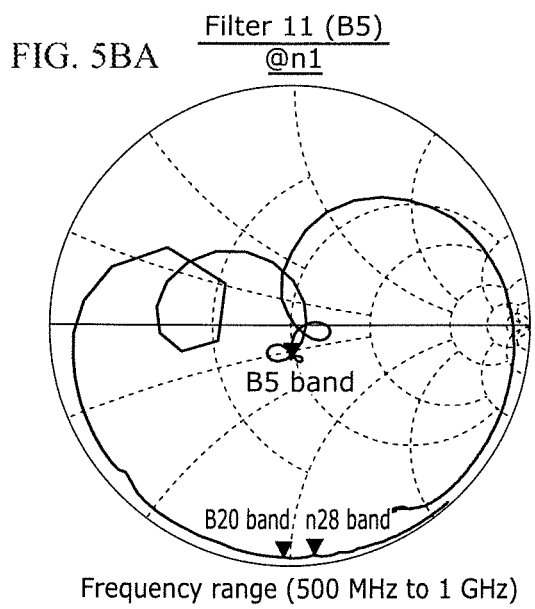
FIG. 5BA  Filter 11 (B5) @n1
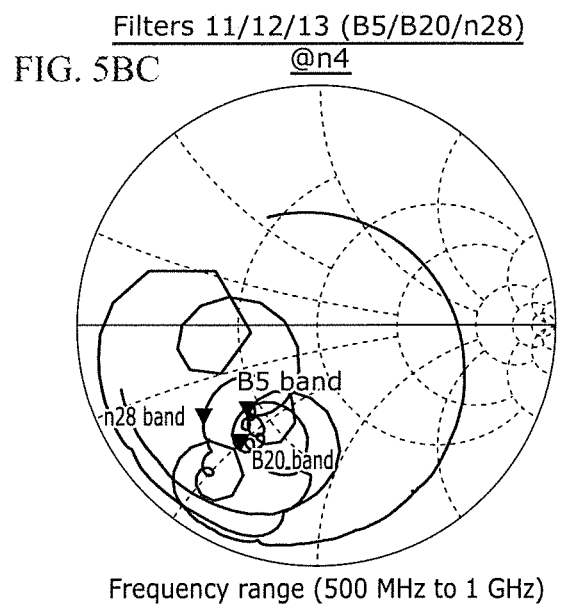
FIG. 5BC  Filters 11/12/13 (B5/B20/n28) @n4
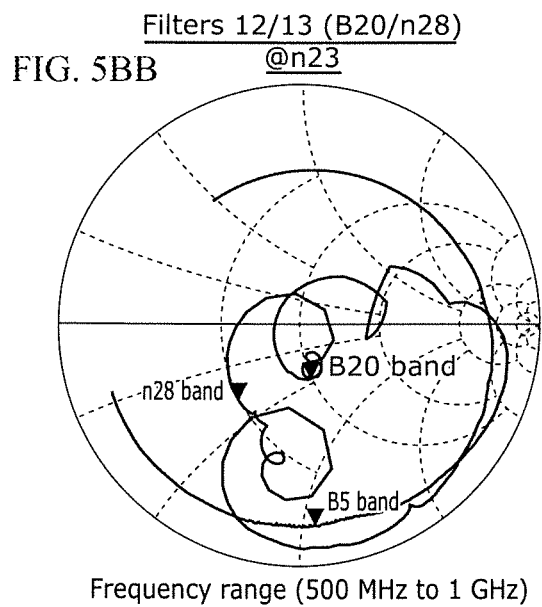
FIG. 5BB  Filters 12/13 (B20/n28) @n23
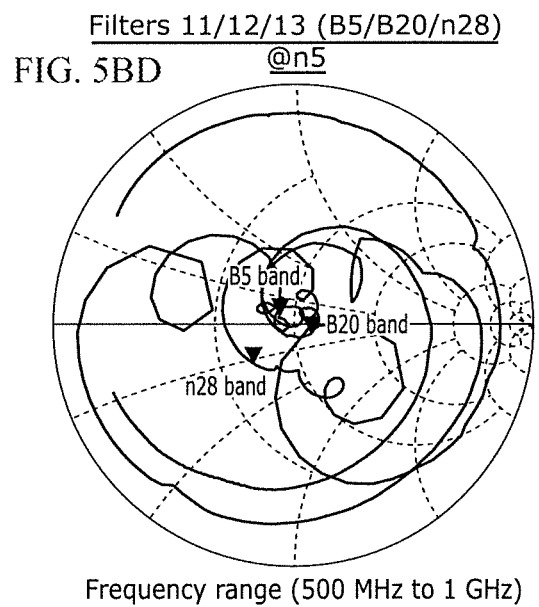
FIG. 5BD  Filters 11/12/13 (B5/B20/n28) @n5

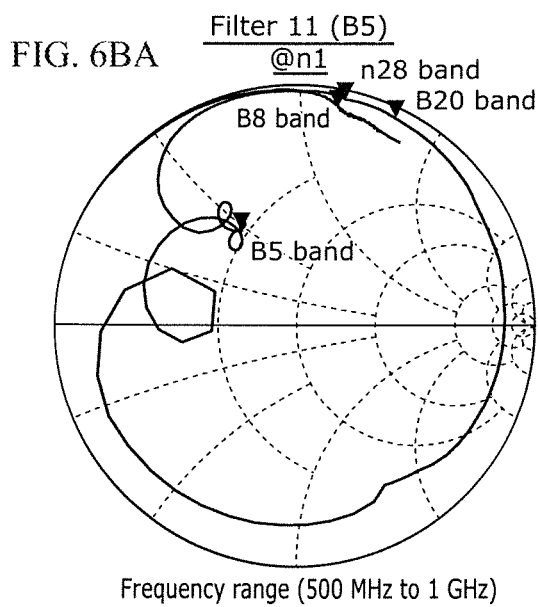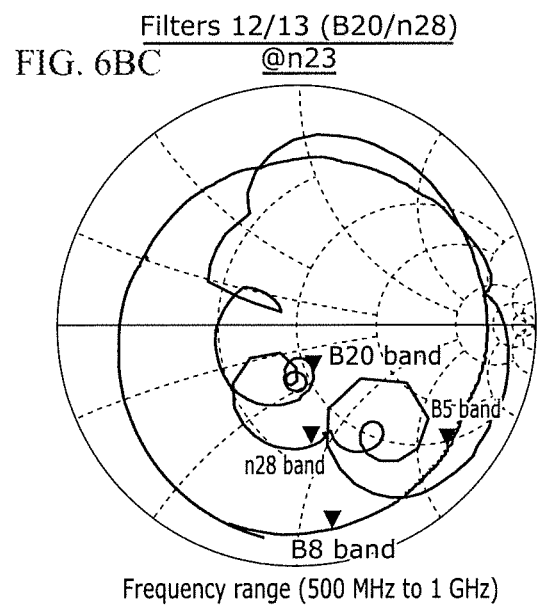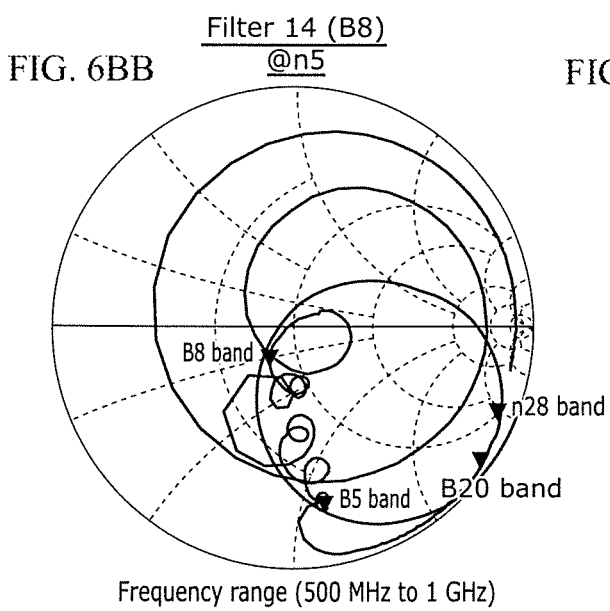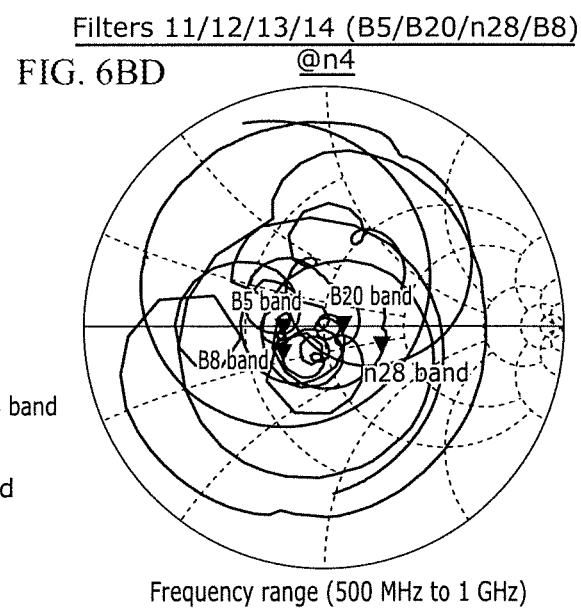

Filter 11 (B41) @n1

Frequency range (500 MHz to 1 GHz)

Filters 12/13 (B3/n3) @n23

Frequency range (500 MHz to 1 GHz)

Filters 11/12/13 (B41/B3/n3) @n4

Frequency range (500 MHz to 1 GHz)

Filters 11/12/13 (B41/B3/n3) @n5

Frequency range (500 MHz to 1 GHz)

Filters 11/13 (B41/n3) @n5

Frequency range (500 MHz to 1 GHz)

Filters 12/13 (B3/n3) @n5

Frequency range (500 MHz to 1 GHz)

Filters 14/11/13 (B40/B1/n3) @n5

Frequency range (500 MHz to 1 GHz)

Filters 12/13 (B3/n3) @n5

Frequency range (500 MHz to 1 GHz)

MULTIPLEXER AND COMMUNICATION DEVICE

CROSS REFERENCE TO RELATED APPLICATION

The present application is based on and claims priority of Japanese Patent Application No. 2019-111022 filed on Jun. 14, 2019. The entire disclosure of the above-identified application, including the specification, drawings and claims is incorporated herein by reference in its entirety.

TECHNICAL FIELD

The present disclosure relates to a multiplexer, and a communication device that includes the multiplexer.

BACKGROUND

U.S. Unexamined Patent Application Publication No. 2018/0034152 discloses a configuration of a transceiver front-end circuit that includes a primary circuit (a multiplexer) and a secondary circuit (a multiplexer) that can demultiplex and multiplex radio frequency signals having different frequency ranges.

BRIEF SUMMARY

If the transceiver front-end circuit disclosed in U.S. Patent Application Publication No. 2018/0034152 is applied to a circuit that simultaneously transfers a plurality of radio frequency signals having overlapping frequency ranges, circuit elements such as an antenna for transferring one of such radio frequency signals and a switch are disposed in the primary circuit (multiplexer), and circuit elements such as an antenna for transferring the other of such radio frequency signals and a switch are disposed in the secondary circuit (a multiplexer). In this case, circuit elements are disposed in each of the primary circuit and the secondary circuit, which results in an increase in the number of circuit elements. Consequently, the size of the transceiver front-end circuit is increased.

In view of the above, the present disclosure is to address such problems, and is to provide a multiplexer and a communication device that are miniaturized and can simultaneously transfer a plurality of radio frequency signals.

In order to provide such a multiplexer as stated above, a multiplexer according to an aspect of the present disclosure includes: a common terminal; a first filter configured to be connected to the common terminal, and having a first passband; a second filter configured to be connected to the common terminal, and having a second passband that at least partially overlaps the first passband; and a third filter configured to be connected to the common terminal, and having a third passband that does not overlap both the first passband and the second passband.

According to the present disclosure, a multiplexer and a communication device that are miniaturized and can simultaneously transfer a plurality of radio frequency signals can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

FIGS. 5BA-5BD illustrate Smith charts showing impedances of the multiplexer according to Variation 2 of Embodiment 1 (in the first example of band application).

FIGS. 6BA to 6BD illustrate Smith charts showing impedance of the multiplexer according to Variation 3 of Embodiment 1 with the second example of band application).

DESCRIPTION OF EMBODIMENTS

The following describes in detail embodiments of the present disclosure, with reference to the drawings. Note that the embodiments described below each show a general or specific example. The numerical values, shapes, materials, elements, the arrangement and connection of the elements, and others indicated in the following embodiments are mere examples, and therefore are not intended to limit the present disclosure. Thus, among the elements in the following embodiments, elements not recited in any of the independent claims are described as arbitrary elements.

In the present disclosure, "connected" means not only when an element is directly connected via a connection terminal and/or a wiring conductor, but also when the element is electrically connected via a passive element such as an inductor and a capacitor.

Embodiment 1

1.1 Configuration of Multiplexer 1 and Communication Device 6

Figure 1:
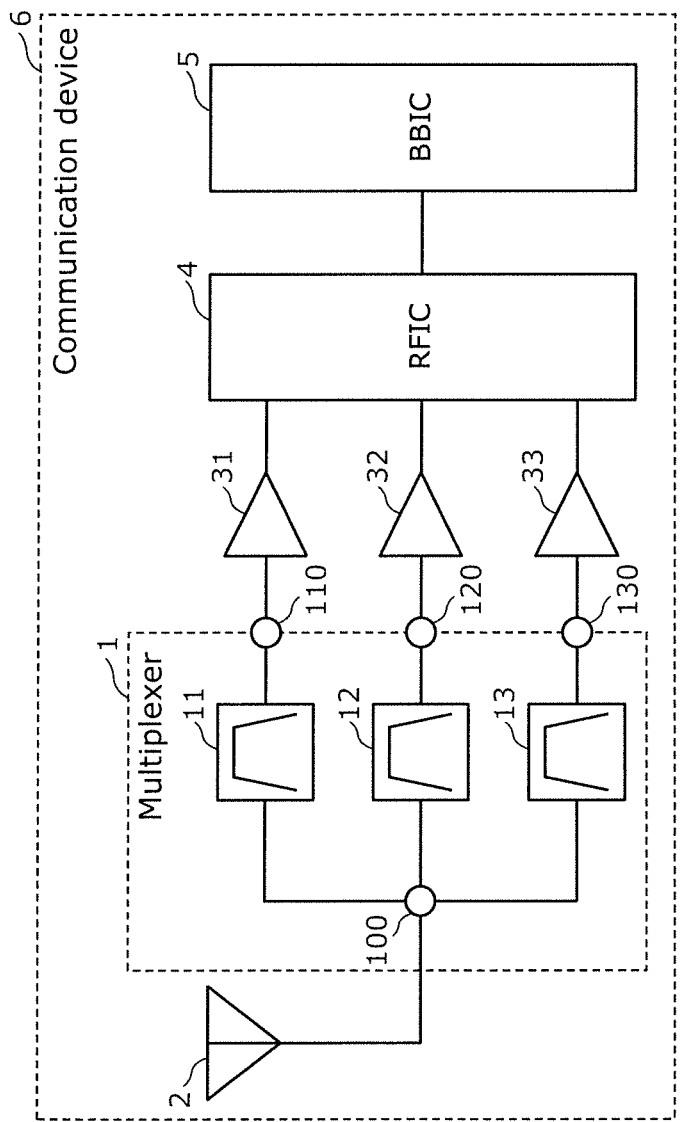
FIG. 1 illustrates an example of a circuit configuration of a multiplexer and a communication device according to Embodiment 1.

FIG. 1 illustrates an example of a circuit configuration of multiplexer 1 and communication device 6 according to Embodiment 1. As illustrated in FIG. 1, communication device 6 includes multiplexer 1, antenna 2, receiving amplifiers 31, 32, and 33, radio frequency (RF) signal processing circuit (RF integrated circuit (RFIC)) 4, and baseband signal processing circuit (baseband IC (BBIC)) 5.

RFIC 4 is an RF signal processing circuit that processes radio frequency signals transmitted and received by antenna 2. Specifically, RFIC 4 processes radio frequency signals (here, received radio frequency signals) input from antenna 2 via multiplexer 1 and receiving amplifiers 31 to 33 by down-conversion, for instance, and outputs received signals generated by being processed to BBIC 5. RFIC 4 may process signals to be transmitted input from BBIC 5 by up-conversion, for instance, and output radio frequency signals (here, radio frequency signals to be transmitted) generated by being processed to antenna 2 via a transmitter circuit included in communication device 6.

BBIC 5 is a circuit that processes signals using an intermediate frequency range lower than the frequency range of a radio frequency signal transferred in multiplexer 1. A signal processed by BBIC 5 is used as, for example, an image signal for image display or an audio signal for conversation through a speaker.

Antenna 2 is an antenna element that is connected to multiplexer 1, and radiates and receives radio frequency signals.

Multiplexer 1 includes common terminal 100, filters 11, 12, and 13, and receiving output terminals 110, 120, and 130.

Common terminal 100 is connected to antenna 2.

Filter 12 is an example of a first filter having a first passband, and includes an input terminal connected to common terminal 100, and an output terminal connected to receiving output terminal 120.

Filter 13 is an example of a second filter having a second passband, and includes an input terminal connected to common terminal 100, and an output terminal connected to receiving output terminal 130.

Filter 11 is an example of a third filter having a third passband, and includes an input terminal connected to common terminal 100, and an output terminal connected to receiving output terminal 110.

Filters 11 to 13 may each be any of, for example, an acoustic wave filter that uses surface acoustic waves (SAWs), an acoustic wave filter that uses bulk acoustic waves (BAWs), an LC resonance filter, and a dielectric filter, and may each have any structure.

Figure 2:
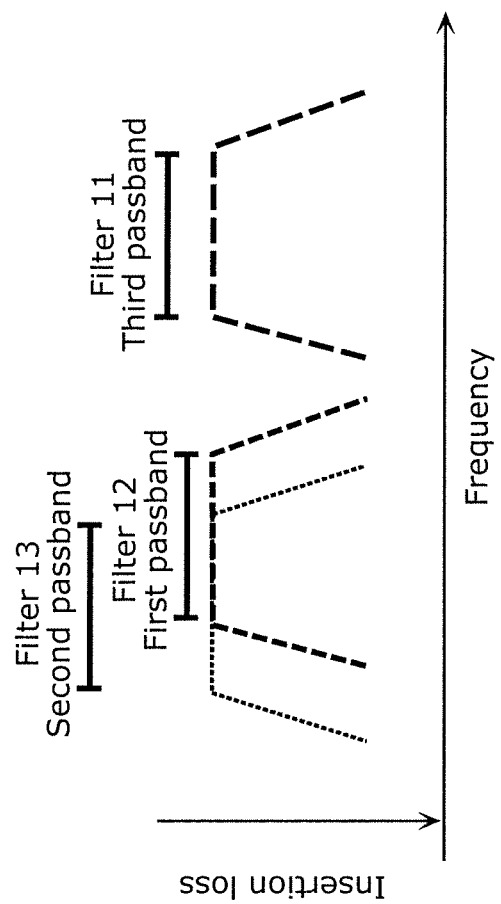
FIG. 2 illustrates a relation of passbands of filters included in the multiplexer according to Embodiment 1.

FIG. 2 illustrates a relation of passbands of filters 11 to 13 included in multiplexer 1 according to Embodiment 1. As illustrated in FIG. 2, the first passband of filter 12 and the second passband of filter 13 at least partially overlap. The third passband of filter 11 does not overlap both the first passband and the second passband. Note that which of the first passband, the second passband, and the third passband is the highest, the second highest, and the lowest is voluntarily determined.

According to the above configuration of multiplexer 1, two or more radio frequency signals having overlapping frequency ranges can be simultaneously transferred using filters 11 to 13 connected to common terminal 100. Accordingly, it is not necessary to dispose circuit elements such as antennas and switches, based on the number of radio frequency signals that are simultaneously transferred, and thus miniaturized multiplexer 1 that can simultaneously transfer a plurality of radio frequency signals can be provided.

In multiplexer 1, common terminal 100 and filters 12 and 13 are connected without switches provided therebetween. The loss due to on resistance of the switches can be prevented from being added to radio frequency signals that pass through filters 12 and 13. Further, radio frequency signals can be prevented from being distorted due to the switches.

Referring back to FIG. 1, the configurations of receiving amplifiers 31 to 33 will be described below.

Receiving amplifier 32 is an example of a first low noise amplifier, and includes an input terminal connected to receiving output terminal 120 of multiplexer 1, and an output terminal connected to RFIC 4. Receiving amplifier 32 amplifies a radio frequency signal that has a frequency range in the first passband, and passes through filter 12.

Receiving amplifier 33 is an example of a second low noise amplifier, and includes an input terminal connected to receiving output terminal 130 of multiplexer 1, and an output terminal connected to RFIC 4. Receiving amplifier 33 amplifies a radio frequency signal that has a frequency range in the second passband, and passes through filter 13.

Receiving amplifier 31 is an example of a third low noise amplifier, and includes an input terminal connected to receiving output terminal 110 of multiplexer 1, and an output terminal connected to RFIC 4. Receiving amplifier 31 amplifies a radio frequency signal that has a frequency range in the third passband, and passes through filter 11.

Note that receiving amplifiers 31 to 33 may be achieved by a single low noise amplifier, and a switch that switches between connection and disconnection of the low noise amplifier to/from receiving output terminals 110, 120, and 130.

1.2 Configuration of Multiplexer 1A According to Variation 1

Figure 3:
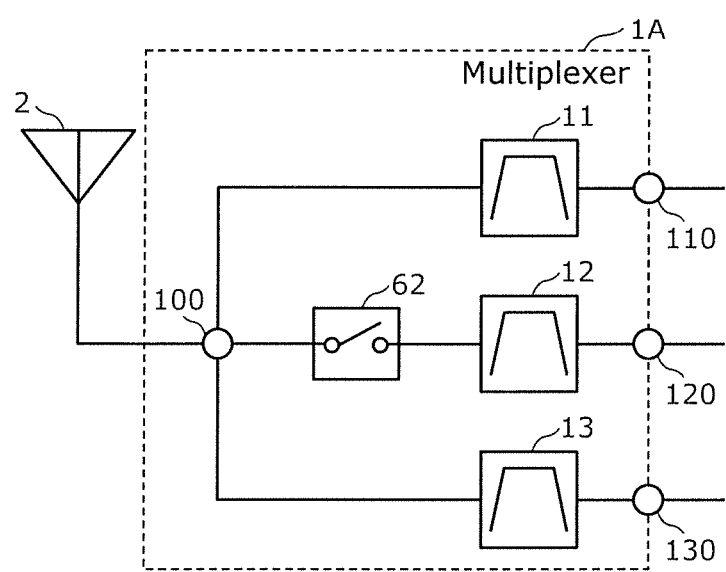
FIG. 3 illustrates a circuit configuration of a multiplexer according to Variation 1 of Embodiment 1 and a peripheral circuit.

FIG. 3 illustrates a circuit configuration of multiplexer 1A according to Variation 1 of Embodiment 1 and a peripheral circuit. As illustrated in FIG. 3, multiplexer 1A according to this variation includes common terminal 100, filters 11, 12, and 13, switch 62, and receiving output terminals 110, 120, and 130. Multiplexer 1A according to this variation is different from multiplexer 1 according to Embodiment 1 in that switch 62 is added. The following describes multiplexer 1A according to this variation, focusing on differences from multiplexer 1 according to Embodiment 1.

Switch 62 is a switch circuit disposed between common terminal 100 and filter 12.

Accordingly, when a radio frequency signal that passes through filter 12 and a radio frequency signal that passes through filter 13 are to be simultaneously transferred, common terminal 100 and filter 12 can be connected by placing switch 62 in the conducting state while common terminal 100 and filter 13 are connected. Further, when a radio frequency signal that passes through filter 13 is allowed to be transferred, and a radio frequency signal that passes through filter 12 is prevented from being transferred, while common terminal 100 and filter 13 are connected, common terminal 100 and filter 12 can be disconnected by placing switch 62 in the non-conducting state. Thus, placing switch 62 in the non-conducting state improves isolation of filter 12, upstream of which switch 62 is disposed, with respect to filters 11 and 13, upstream of which no switches are disposed. Consequently, this improves passing characteristics of multiplexer 1A. Note that switch 62 may be disposed between common terminal 100 and filter 13, or alternatively, a switch may be disposed between common terminal 100 and filter 12 and another switch may be disposed between common terminal 100 and filter 13.

In multiplexer 1A according to this variation, common terminal 100 and filter 11 are connected without a switch provided therebetween.

Even if filter 11 having a passband that does not overlap the passbands of filters 12 and 13 is always connected to common terminal 100 when a radio frequency signal that passes through filter 12 and a radio frequency signal that passes through filter 13 are simultaneously transferred, such a state has little influence on the simultaneous transfer of such two radio frequency signals. Accordingly, no switch is necessary between filter 11 and common terminal 100, and thus multiplexer 1A can be miniaturized.

1.3 Impedance Matching of Multiplexer 1 (a First Example of Band Application)

Figure 4A:
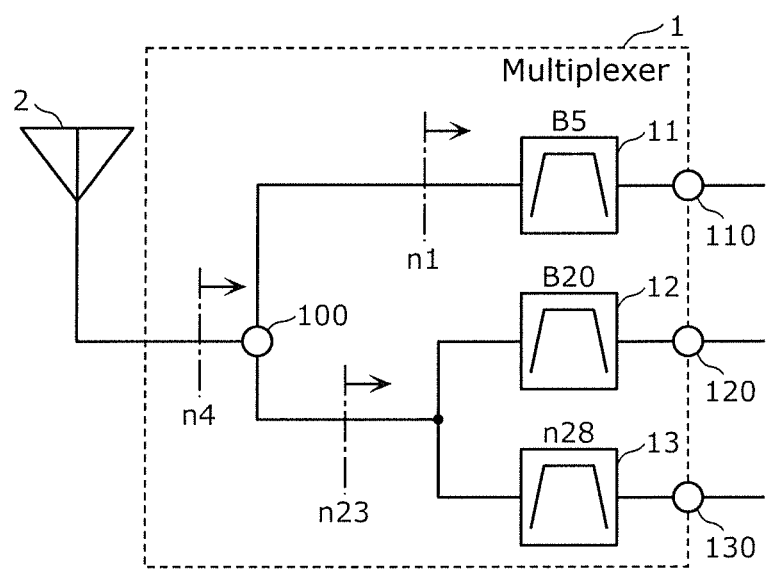
FIG. 4A illustrates an example of a circuit configuration (showing nodes) of the multiplexer according to Embodiment 1 (with a first example of band application).

FIG. 4A illustrates a circuit configuration (showing nodes) of multiplexer 1 according to Embodiment 1 with a first example of band application. As the first example of band application, Band 20 (a receiving band from 791 MHz to 821 MHz) for the Evolved Universal Terrestrial Radio Access (E-UTRA) in the fourth generation mobile communication system (4G) is applied to the first passband of filter 12, n28 (a receiving band from 758 MHz to 803 MHz) for New Radio (NR) in the fifth generation mobile communication system (5G) is applied to the second passband of filter 13, and Band 5 (a receiving band from 869 MHz to 894 MHz) for 4G E-UTRA is applied to the third passband of filter 11 in this example of Embodiment 1 as illustrated in FIG. 4A. In the first example of band application, the relation of the first passband, the second passband, and the third passband are the same as the relation of passbands illustrated in FIG. 2.

Note that the band of the IEEE 802.11 wireless local area network (WLAN) may be applied to the first passband of filter 12 or the second passband of filter 13, as an example of band application other than the first example of band application.

For example, Band 46 (5.15 GHz to 5.35 GHz) for 4G may be applied to the first passband of filter 12, and a WLAN (5.15 GHz to 5.35 GHz) may be applied to the second passband of filter 13.

A WLAN (5.15 GHz to 5.35 GHz) may be applied to the first passband of filter 12, and NR-U (5.15 GHz to 5.925 GHz) for 5G may be applied to the second passband of filter 13.

Further, Band 46 for 4G may be applied to the first passband of filter 12, and NR-U for 5G may be applied to the second passband of filter 13.

Note that if such combinations of the first passband and the second passband are adopted, a communication band (for example, n77 or n79) within the ultra-high band (3.2 GHz to 5.0 GHz) is applied to the third passband of filter 11.

Note that at least a partial band of the frequency range from 5.15 GHz to 7.125 GHz may be applied to a WLAN.

Extremely high frequency bands for 5G may be applied to at least one of the first passband of filter 12 or the second passband of filter 13, and the third passband of filter 11. For example, n257 (26.5 GHz to 29.5 GHz) for 5G may be applied to the first passband of filter 12, n258 (24.25 GHz to 27.5 GHz) or n261 (27.5 GHz to 28.35 GHz) for 5G may be applied to the second passband of filter 13, and n259 (39.5 GHz to 43.5 GHz) or n260 (37 GHz to 40 GHz) for 5G may be applied to the third passband of filter 11.

Figure 4B:
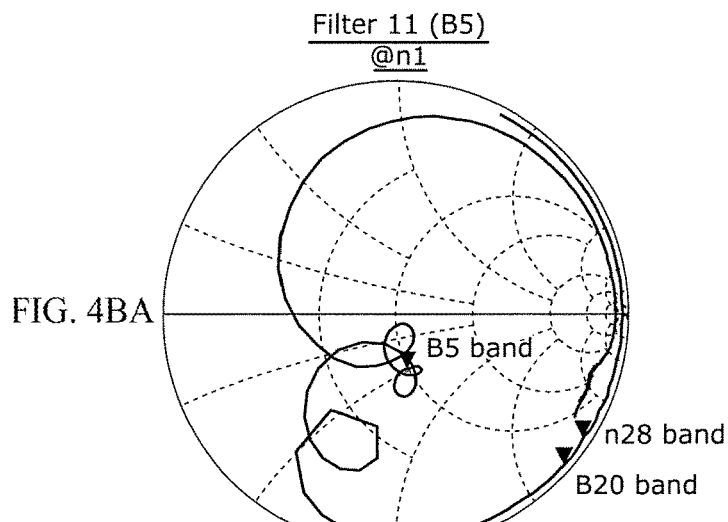
FIGS. 4BA to 4BC illustrate Smith charts showing impedances of the multiplexer according to Embodiment 1 (with the first example of band application).
Figure 4B:
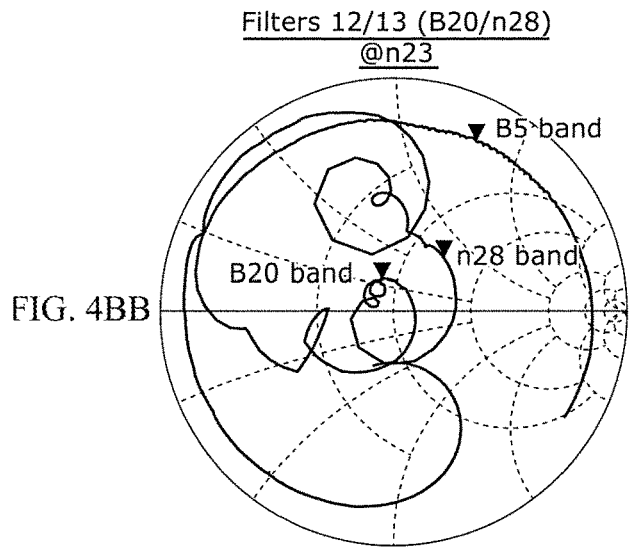
Figure 4B:
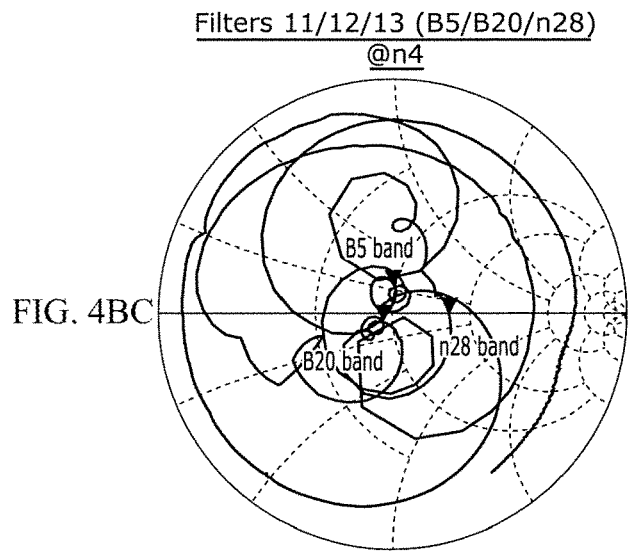

FIGS. 4BA-4BC illustrate Smith charts showing impedances of multiplexer 1 according to Embodiment 1 with the first example of band application. FIG. 4BA illustrates input impedance of filter 11 as viewed from node n1 (illustrated in FIG. 4A). More specifically, FIG. 4BA illustrates input impedance of filter 11 alone as viewed from node n1 in a state where filters 12 and 13 are not connected to common terminal 100. FIG. 4BB illustrates input impedance of a combined circuit of filters 12 and 13 as viewed from node n23 (illustrated in FIG. 4A). More specifically, FIG. 4BB illustrates input impedance of the combined circuit of filters 12 and 13 as viewed from node n23 in a state where filter 11 is not connected to common terminal 100. FIG. 4BC illustrates input impedance of multiplexer 1 as viewed from node n4 (illustrated in FIG. 4A). More specifically, FIG. 4BC illustrates input impedance of multiplexer 1 as viewed from node n4 in a state where filters 11 to 13 are connected to common terminal 100.

In FIG. 4BA, an input impedance in the third passband (Band 5) of filter 11 is located in a capacitive region. On the other hand, in FIG. 4BB, an input impedance in the third passband (Band 5) of the combined circuit of filters 12 and 13 is located in an inductive region. Thus, an input impedance in the third passband (Band 5) of filter 11 and an input impedance in the third passband (Band 5) of the combined circuit of filters 12 and 13 are in a complex conjugate relation. Accordingly, as can be seen from FIG. 4BC, input impedance in the third passband (Band 5) of multiplexer 1 is matched to impedance close to reference impedance (for example, 50Ω).

In FIG. 4BA, an input impedance in the first passband (Band 20) of filter 11 is located in the capacitive region. On the other hand, in FIG. 4BB, an input impedance in the first passband (Band 20) of the combined circuit of filters 12 and 13 is located in the inductive region. Thus, an input impedance in the first passband (Band 20) of filter 11 and an input impedance in the first passband (Band 20) of the combined circuit of filters 12 and 13 are in a complex conjugate relation. Accordingly, as can be seen from FIG. 4BC, an input impedance in the first passband (Band 20) of multiplexer 1 is matched to impedance close to reference impedance (for example, 50Ω).

In FIG. 4BA, an input impedance in the second passband (n28) of filter 11 is located in the capacitive region. On the other hand, in FIG. 4BB, an input impedance in the second passband (n28) of the combined circuit of filters 12 and 13 is located in the inductive region. Thus, an input impedance in the second passband (n28) of filter 11 and an input impedance in the second passband (n28) of the combined circuit of filters 12 and 13 are in a complex conjugate relation. Accordingly, as can be seen from FIG. 4BC, an input impedance in the second passband (n28) of multiplexer 1 is matched to impedance close to reference impedance (for example, 50Ω). Thus, an input impedance of filter 11 having a passband that does not overlap the passbands of filters 12 and 13, and an input impedance of the combined circuit of filters 12 and 13 that have overlapping passbands are in a complex conjugate relation, so that impedance matching can be achieved for input impedance of multiplexer 1.

Figure 4C:
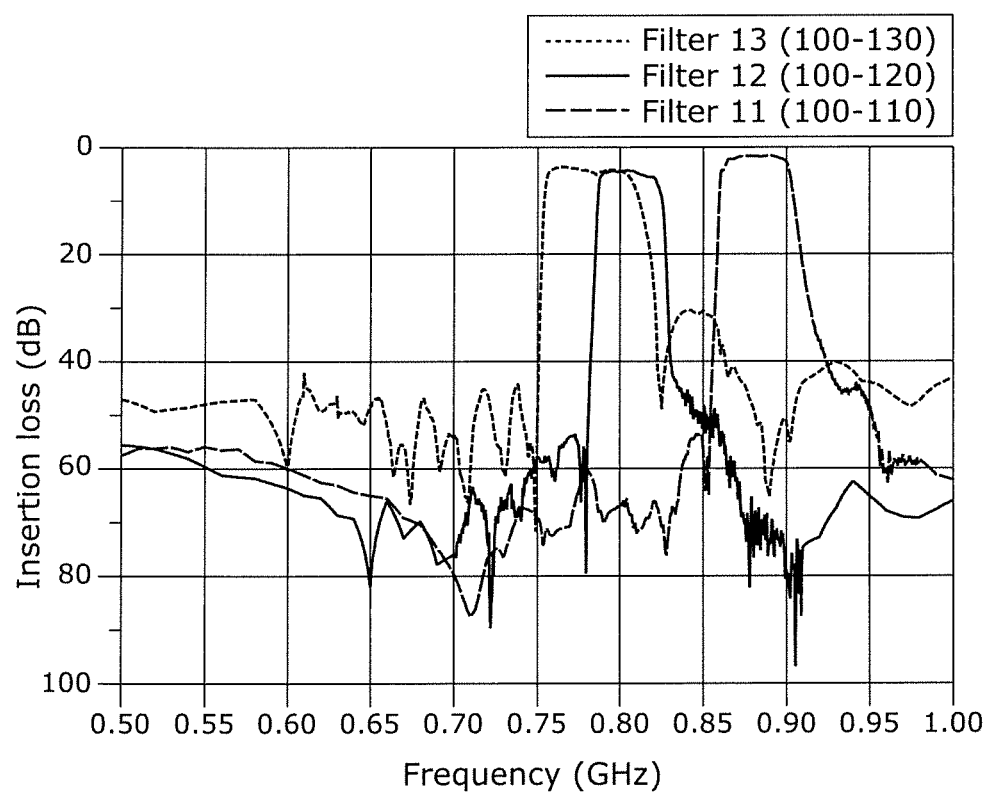
FIG. 4C illustrates a graph showing passing characteristics of the filters in the multiplexer according to Embodiment 1 (with the first example of band application).

FIG. 4C illustrates a graph diagram showing passing characteristics of filters 11 to 13 in multiplexer 1 according to Embodiment 1 with the first example of band application. The impedance matching achieved by establishing the complex conjugate relation described above achieves decrease in loss in the passbands and increase in attenuations in the attenuation bands of filters 11 to 13, as illustrated in FIG. 4C. Thus, a 4G radio frequency signal that passes through filter 11, a 4G radio frequency signal that passes through filter 12, and a 5G radio frequency signal that passes through filter 13 can be simultaneously transferred while low loss and high isolation are achieved.

Note that in this example, a 4G (Band 20) radio frequency signal and a 5G (n28) radio frequency signal that have at least partially overlapping frequency ranges can be simultaneously transferred (using E-UTRA-NR Dual Connectivity (EN-DC)) while low loss and high isolation are ensured.

Note that in this specification, the expression "two impedances are in a complex conjugate relation" means complex components of the two impedances cancel out each other so as to be or close to 0. Thus, when one impedance is indicated by $R_1+jX_1$, and the other impedance is indicated by $R_2+jX_2$, the above expression means that the relations $X_1>0$ and $X_2<0$ are satisfied (one impedance is inductive, and the other impedance is capacitive), and more specifically, the above expression means that the relation $X_1+X_2=0$ is satisfied.

Note that a matching circuit may be disposed between node n1 and filter 11 in order to make input impedance of filter 11 as viewed from node n1 capacitive. Further, a matching circuit may be disposed between node n23 and the combined circuit of filters 12 and 13 in order to make input impedance of the combined circuit as viewed from node n23 inductive.

1.4 Impedance Matching of Multiplexer 1B (First Example of Band Application)

Figure 5A:
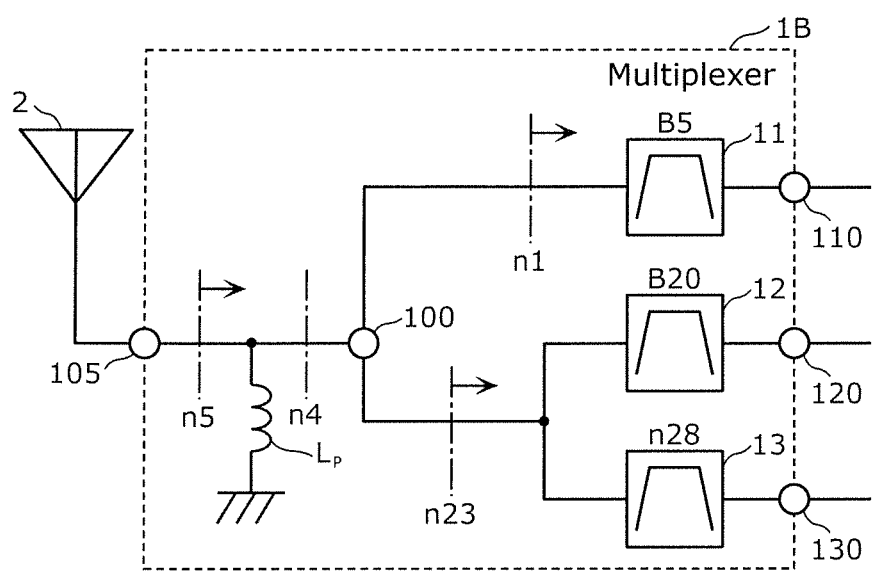
FIG. 5A illustrates an example of a circuit configuration (showing nodes) of a multiplexer according to Variation 2 of Embodiment 1 (with the first example of band application).

FIG. 5A illustrates a circuit configuration (showing nodes) of multiplexer 1B according to Variation 2 of Embodiment 1 with the first example of band application. As illustrated in FIG. 5A, multiplexer 1B includes common terminal 100, filters 11, 12, and 13, inductor $L_P$, antenna common terminal 105, and receiving output terminals 110, 120, and 130. Multiplexer 1B according to this variation is different from multiplexer 1 according to Embodiment 1 in that inductor $L_P$ and antenna common terminal 105 are added. Only the configuration of multiplexer 1B according to this variation different from the configuration of multiplexer 1 according to Embodiment 1 is to be described.

Antenna common terminal 105 is connected to common terminal 100 and antenna 2. Inductor $L_P$ is an impedance matching element connected between the ground and a connection node of common terminal 100 and antenna common terminal 105.

Note that inductor $L_P$ may be disposed in series on a path that connects common terminal 100 and antenna common terminal 105. A capacitor may be disposed instead of inductor $L_P$, or alternatively, a matching circuit that includes at least one inductor and/or at least one capacitor may be disposed.

As the first example of band application, Band 20 for 4G E-UTRA is applied to the first passband of filter 12, n28 for 5G NR is applied to the second passband of filter 13, and Band 5 for 4G E-UTRA is applied to the third passband of filter 11, in this variation as illustrated in FIG. 5A.

FIGS. 5BA to 5BD illustrate Smith charts showing impedance of multiplexer 1B according to Variation 2 of Embodiment 1 with the first example of band application. FIG. 5BA illustrates an input impedance of filter 11 as viewed from node n1 (illustrated in FIG. 5A). FIG. 5BB illustrates an input impedance of the combined circuit of filters 12 and 13 as viewed from node n23 (illustrated in FIG. 5A). FIG. 5BC illustrates an input impedance of the combined circuit of filters 11 to 13 as viewed from node n4 (illustrated in FIG. 5A). FIG. 5BD illustrates an input impedance of multiplexer 1B as viewed from node n5 (illustrated in FIG. 5A).

In FIG. 5BA, the input impedance in the third passband (Band 5), the input impedance in the first passband (Band 20), and the input impedance in the second passband (n28) of filter 11 as viewed from node n1 are located in the capacitive region. In FIG. 5BB, the input impedance in the third passband (Band 5), the input impedance in the first passband (Band 20), and the input impedance in the second passband (n28) of the combined circuit of filters 12 and 13 as viewed from node n23 are located in the capacitive region. Accordingly, in FIG. 5BC, the input impedance in the third passband (Band 5), an input impedance in the first passband (Band 20), and the input impedance in the second passband (n28) of the combined circuit of filters 11 to 13 as viewed from node n4 are located in the capacitive region, and are concentrated in particularly the third quadrant of the Smith chart. The input impedance of the combined circuit of filters 11 to 13 as viewed from node n4 shifts counterclockwise on the equiconductance circle on the admittance chart due to inductor $L_P$. Thus, as can be seen from FIG. 5BD, the input impedance of multiplexer 1B as viewed from node n5 is matched to impedance close to reference impedance (for example, 50Ω).

Accordingly, the input impedance of filter 11 having a passband that does not overlap the passbands of filters 12 and 13, and the input impedance of the combined circuit of filters 12 and 13 having overlapping passbands are both located in the capacitive region or in the inductive region. Thus, impedance matching can be achieved for the input impedance of multiplexer 1B by disposing an impedance matching element between antenna common terminal 105 and common terminal 100.

Figure 5C:
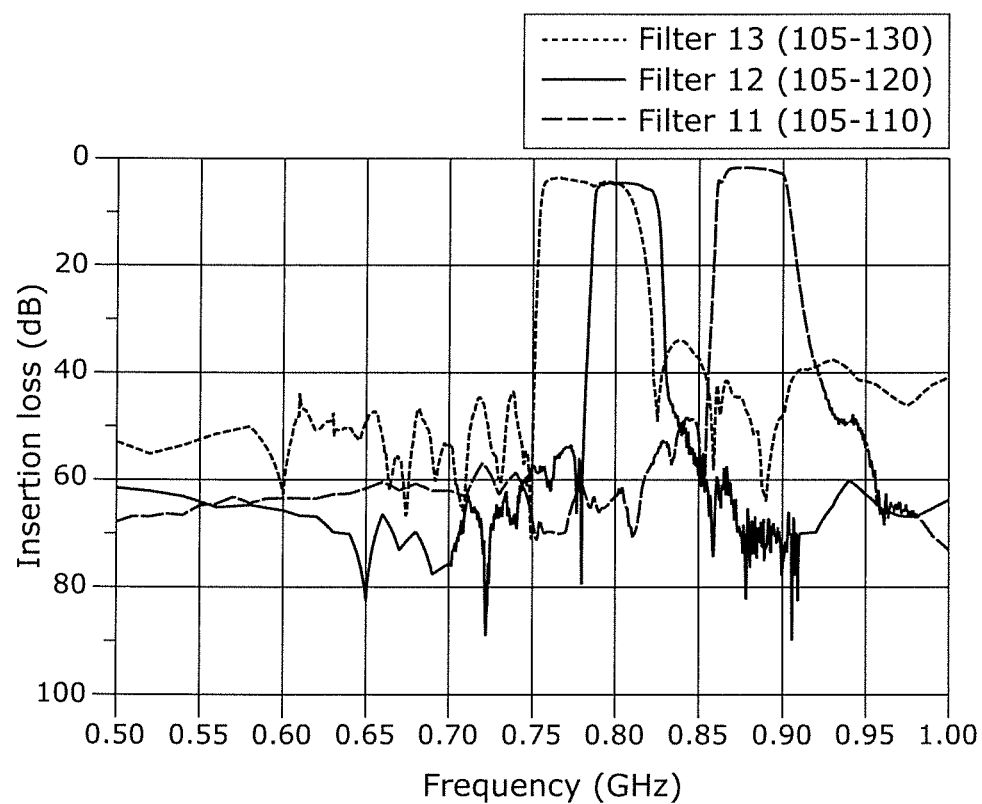
FIG. 5C illustrates a graph showing passing characteristics of the filters in the multiplexer according to Variation 2 of Embodiment 1 (with the first example of band application).

FIG. 5C illustrates a graph showing passing characteristics of filters 11 to 13 in multiplexer 1B according to Variation 2 of Embodiment 1 with the first example of band application. Impedance matching achieved by concentration in the capacitive region as described above achieves decrease in loss in the passbands and increase in attenuations in the attenuation bands of filters 11 to 13 as illustrated in FIG. 5C. Accordingly, a 4G radio frequency signal that passes through filter 11, a 4G radio frequency signal that passes through filter 12, and a 5G radio frequency signal that passes through filter 13 can be simultaneously transferred while low loss and high isolation are achieved.

Note that in this variation, a 4G (Band 20) radio frequency signal and a 5G (n28) radio frequency signal that have at least partially overlapping frequency ranges can be simultaneously transferred (using EN-DC) while low loss and high isolation are ensured.

1.5 Impedance Matching of Multiplexer 1C (Second Example of Band Application)

Figure 6A:
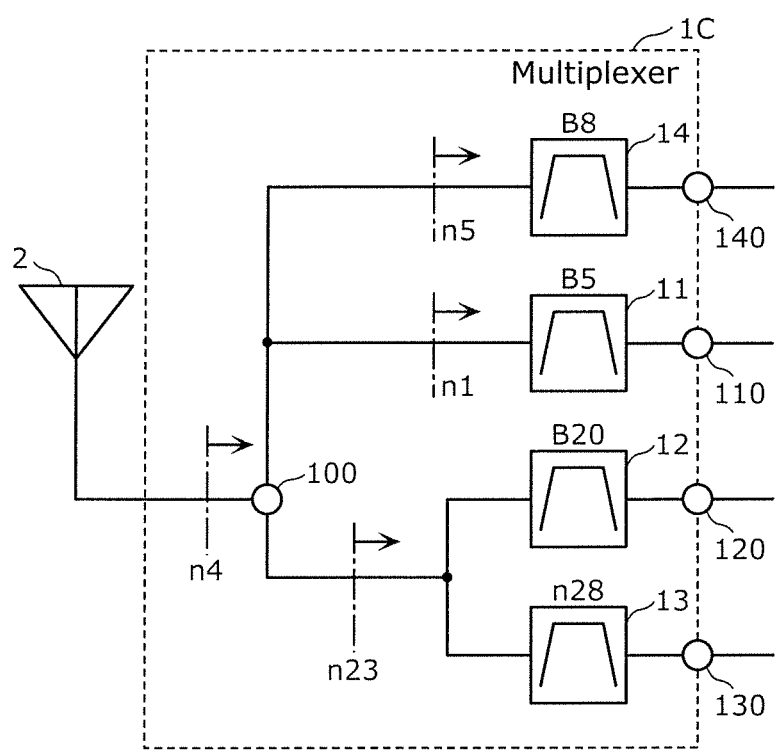
FIG. 6A illustrates an example of a circuit configuration (showing nodes) of a multiplexer according to Variation 3 of Embodiment 1 with a second example of band application).

FIG. 6A illustrates a circuit configuration (showing nodes) of multiplexer 1C according to Variation 3 of Embodiment 1 in a second example of band application. As illustrated in FIG. 6A, multiplexer 1C includes common terminal 100, filters 11, 12, 13, and 14, and receiving output terminals 110, 120, 130, and 140. Multiplexer 1C according to this variation is different from multiplexer 1 according to Embodiment 1 in that filter 14 and receiving output terminal 140 are added. Only the configuration of multiplexer 1C according to this variation different from the configuration of multiplexer 1 according to Embodiment 1 is to be described.

Filter 14 is an example of a fourth filter having a fourth passband, and includes an input terminal connected to common terminal 100, and an output terminal connected to receiving output terminal 140.

The first passband of filter 12 and the second passband of filter 13 at least partially overlap. The third passband of filter 11 does not overlap both the first passband and the second passband. The fourth passband of filter 14 does not overlap all the first passband, the second passband, and the third passband.

As the second example of band application, Band 20 for 4G E-UTRA is applied to the first passband of filter 12, n28 for 5G NR is applied to the second passband of filter 13, Band 5 for 4G E-UTRA is applied to the third passband of filter 11, and Band 8 (receiving band: 925 MHz to 960 MHz) for 4G E-UTRA is applied to the fourth passband of filter 14, in this variation as illustrated in FIG. 6A.

FIGS. 6BA-6BD illustrate Smith charts showing impedances of multiplexer 1C according to Variation 3 of Embodiment 1 with the second example of band application. FIG. 6BA illustrates input impedance of filter 11 as viewed from node n1 (illustrated in FIG. 6A). FIG. 6BB illustrates input impedance of filter 14 as viewed from node n5 (illustrated in FIG. 6A). FIG. 6BC illustrates input impedance of the combined circuit of filters 12 and 13 as viewed from node n23 (illustrated in FIG. 6A). FIG. 6BD illustrates input impedance of multiplexer 1C as viewed from node n4 (illustrated in FIG. 6A).

In FIG. 6BA, the input impedance in the third passband (Band 5), the input impedance in the first passband (Band 20), the input impedance in the second passband (n28), and the input impedance in the fourth passband (Band 8) of filter 11 as viewed from node n1 are all located in the inductive region. On the other hand, in FIG. 6BB, the input impedance in the fourth passband (Band 8), the input impedance in the first passband (Band 20), the input impedance in the second passband (n28), and the input impedance in the third passband (Band 5) of filter 14 as viewed from node n5 are all located in the capacitive region. In FIG. 6BC, the input impedance in the first passband (Band 20), the input impedance in the second passband (n28), the input impedance in the third passband (Band 5), and input impedance in the fourth passband (Band 8) of the combined circuit of filters 12 and 13 as viewed from node n23 are located in the capacitive region.

Here, (i) the input impedance of filter 14 in the first passband (Band 20) and the input impedance of the combined circuit of filters 12 and 13 in the first passband (Band 20) and (ii) the input impedance of filter 11 in the first passband (Band 20) are in a complex conjugate relation. Further, (i) the input impedance of filter 14 in the second passband (n28) and the input impedance of the combined circuit of filters 12 and 13 in the second passband (n28) and (ii) the input impedance of filter 11 in the second passband (n28) are in a complex conjugate relation. Further, (i) the input impedance of filter 14 in the third passband (Band 5) and the input impedance of the combined circuit of filters 12 and 13 in the third passband (Band 5) and (ii) the input impedance of filter 11 in the third passband (Band 5) are in a complex conjugate relation. Further, (i) the input impedance of filter 14 in the fourth passband (Band 8) and the input impedance of the combined circuit of filters 12 and 13 in the fourth passband (Band 8) and (ii) the input impedance of filter 11 in the fourth passband (Band 8) are in a complex conjugate relation. Accordingly, as can be seen from FIG. 6BD, the input impedance in the first passband (Band 20), the input impedance in the second passband (n28), the input impedance in the third passband (Band 5), and the input impedance in the fourth passband (Band 8) of multiplexer 1C as viewed from node n4 are each matched to impedance close to reference impedance (for example, 50Ω). That is, impedance matching can be achieved for the input impedance of multiplexer 1C by establishing a complex conjugate relation between (i) the input impedance of filter 11 having a passband that does not overlap the passbands of filters 12, 13, and 14 and (ii) the input impedance of the combined circuit of filters 12 and 13 having overlapping passbands and input impedance of filter 14 having a non-overlapping passband that does not overlap the passbands of filters 11, 12, and 13.

Figure 6C:
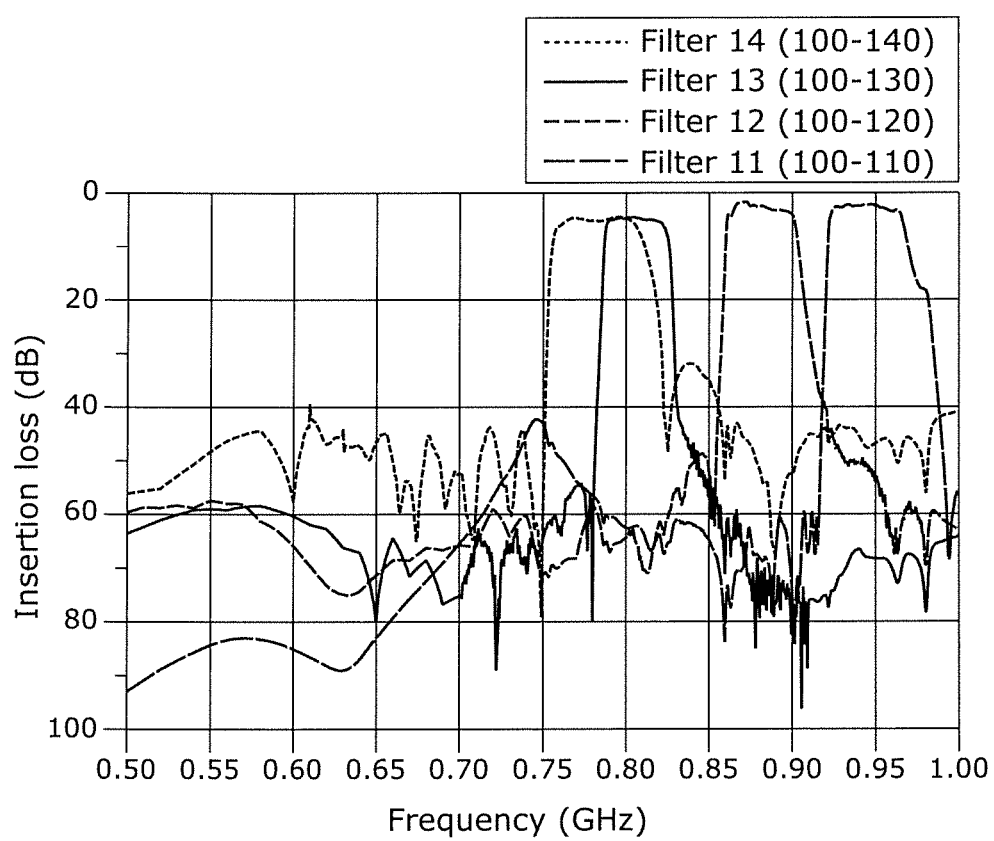
FIG. 6C illustrates a graph showing passing characteristics of the filters in the multiplexer according to Variation 3 of Embodiment 1 with the second example of band application).

FIG. 6C illustrates a graph showing passing characteristics of filters 11 to 14 in the second example of band application of multiplexer 1C according to Variation 3 of Embodiment 1. Impedance matching achieved by establishing the complex conjugate relation described above achieves decrease in loss in the passbands and increase in attenuations in the attenuation bands of filters 11 to 14 as illustrated in FIG. 6C. Accordingly, a 4G radio frequency signal that passes through filter 11, a 4G radio frequency signal that passes through filter 12, a 5G radio frequency signal that passes through filter 13, and a 4G radio frequency signal that passes through filter 14 can be simultaneously transferred while low loss and high isolation are achieved.

Note that in this variation, a 4G (Band 20) radio frequency signal and a 5G (n28) radio frequency signal that have at least partially overlapping frequency ranges can be simultaneously transferred (using EN-DC) while low loss and high isolation are ensured.

Note that a matching circuit may be disposed between node n1 and filter 11 in order to make input impedance of filter 11 as viewed from node n1 inductive. Further, a matching circuit may be disposed between node n5 and filter 14 in order to make input impedance of filter 14 as viewed from node n5 capacitive. Further, a matching circuit may be disposed between node n23 and the combined circuit of filters 12 and 13 in order to make input impedance of the combined circuit as viewed from node n23 capacitive.

1.6 Impedance Matching of Multiplexer 1 (Third Example of Band Application)

Figure 7A:
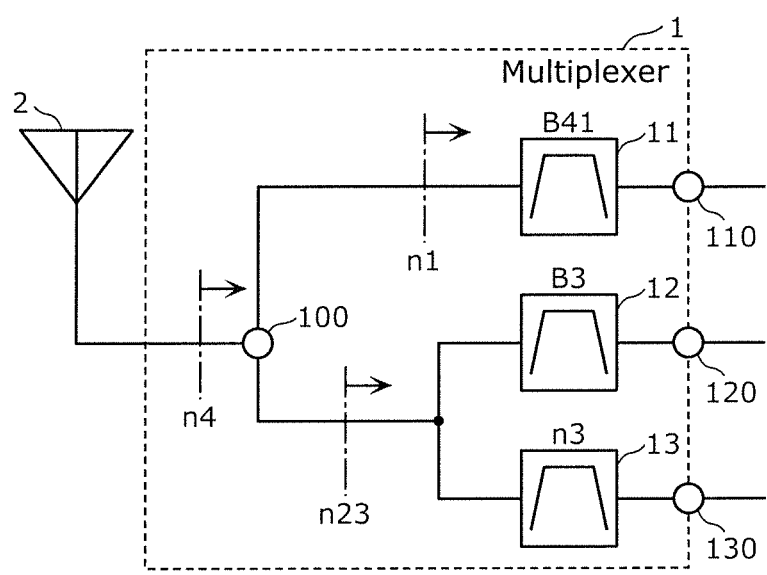
FIG. 7A illustrates a circuit configuration (showing nodes) of the multiplexer according to Embodiment 1 (in a third example of band application).

FIG. 7A illustrates an example of a circuit configuration (showing nodes) of multiplexer 1 according to Embodiment 1 in a third example of band application. As the third example of band application, Band 3 (receiving band: 1805 MHz to 1880 MHz) for 4G E-UTRA is applied to the first passband of filter 12, n3 (receiving band: 1805 MHz to 1880 MHz) for 5G NR is applied to the second passband of filter 13, and Band 41 (band: 2496 MHz to 2690 MHz) for 4G E-UTRA is applied to the third passband of filter 11, in this example as illustrated in FIG. 7A. In the third example of band application, the first passband of filter 12 and the second passband of filter 13 completely overlap. The third passband of filter 11 does not overlap both the first passband and the second passband.

Figure 7B:
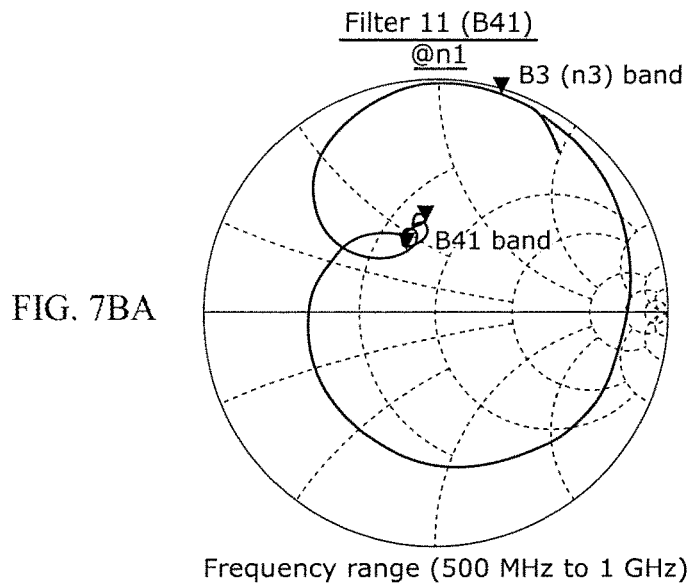
FIGS. 7BA to 7BC illustrate Smith charts showing impedance of the multiplexer according to Embodiment 1 (in the third example of band application).
Figure 7B:
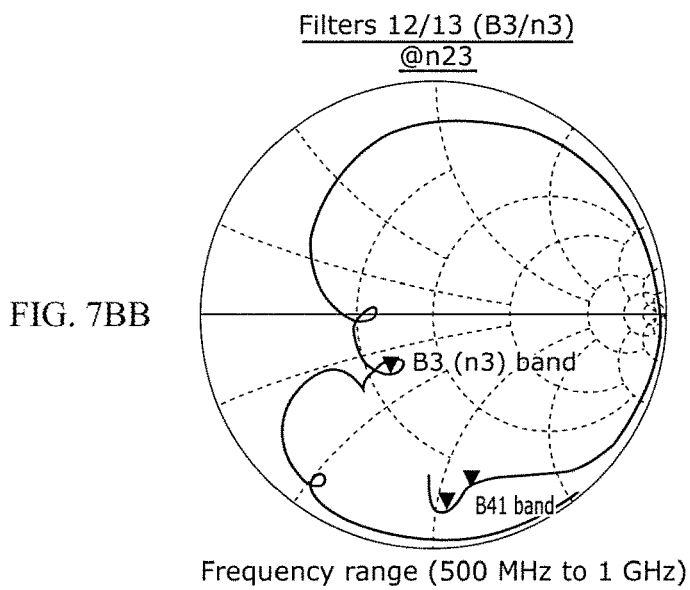
Figure 7B:
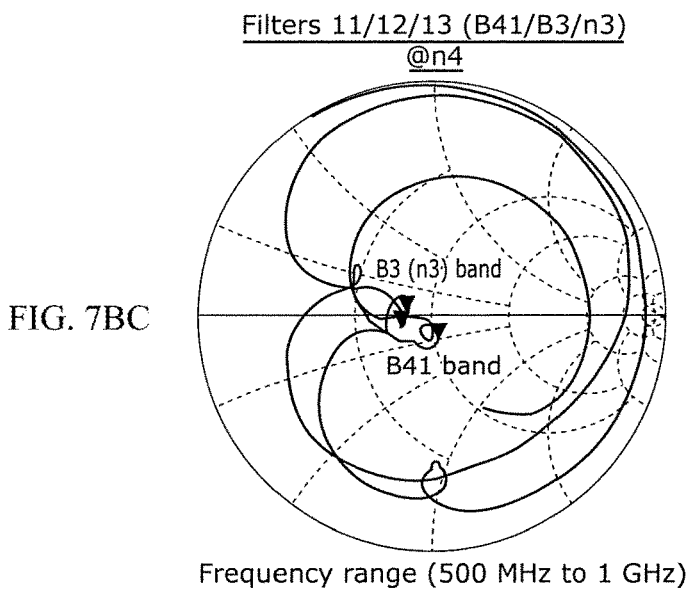

FIG. 7BA to 7BC illustrate Smith charts showing the impedances of multiplexer 1 according to Embodiment 1 with the third example of band application. FIG. 7BA illustrates the input impedance of filter 11 as viewed from node n1 (illustrated in FIG. 7A). FIG. 7BB illustrates the input impedance of the combined circuit of filters 12 and 13 as viewed from node n23 (illustrated in FIG. 7A). FIG. 7BC illustrates the input impedance of multiplexer 1 as viewed from node n4 (illustrated in FIG. 7A).

In FIG. 7BA, the input impedance of filter 11 in the third passband (Band 41) as viewed from node n1 is located in the inductive region. On the other hand, in FIG. 7BB, the input impedance of the combined circuit of filters 12 and 13 in the third passband (Band 41) as viewed from node n23 is located in the capacitive region. That is, the input impedance of filter 11 in the third passband (Band 41) as viewed from node n1, and input the impedance of the combined circuit of filters 12 and 13 in the third passband (Band 41) as viewed from node n23 are in a complex conjugate relation. Accordingly, as can be seen from FIG. 7BC, input impedance of multiplexer 1 in the third passband (Band 41) as viewed from node n4 is matched to impedance close to reference impedance (for example, 50Ω).

In FIG. 7BA, the input impedance of filter 11 in the first passband (Band 3)/the second passband (n3) as viewed from node n1 is located in the inductive region. On the other hand, in FIG. 7BB, the input impedance of the combined circuit of filters 12 and 13 in the first passband (Band 3)/the second passband (n3) as viewed from node n23 is located in the capacitive region. Thus, (i) the input impedance of filter 11 in the first passband (Band 3)/the second passband (n3) as viewed from node n1 and (ii) the input impedance of the combined circuit of filters 12 and 13 in the first passband (Band 3)/the second passband (n3) as viewed from node n23 are in a complex conjugate relation. Accordingly, as be seen from FIG. 7BC, the input impedance of multiplexer 1 in the first passband (Band 3)/the second passband (n3) as viewed from node n4 is matched to impedance close to reference impedance (for example, 50Ω).

Figure 7C:
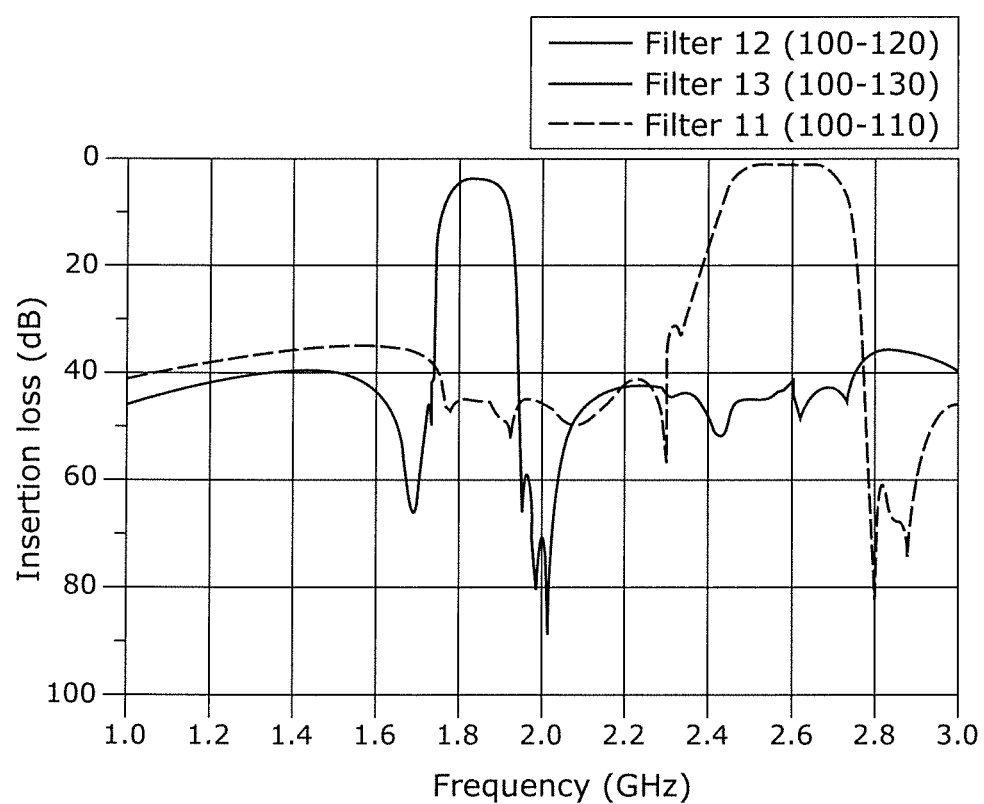
FIG. 7C illustrates a graph showing passing characteristics of the filters in the multiplexer according to Embodiment 1 (with the third example of band application).

FIG. 7C illustrates a graph showing passing characteristics of filters 11 to 13 in multiplexer 1 according to Embodiment 1 with the third example of band application. Impedance matching achieved by establishing the complex conjugate relation described above achieves decrease in loss in the passbands and increase in attenuations in the attenuation bands of filters 11 to 13, as illustrated in FIG. 7C. Accordingly, a 4G radio frequency signal that passes through filter 11, a 4G radio frequency signal that passes through filter 12, and a 5G radio frequency signal that passes through filter 13 can be simultaneously transferred while low loss and high isolation are achieved.

Note that in this example, a 4G (Band 3) radio frequency signal and a 5G (n3) radio frequency signal that have completely overlapping frequency ranges can be simultaneously transferred (using EN-DC) while low loss and high isolation are ensured.

Note that a matching circuit may be disposed between node n1 and filter 11 in order to make the input impedance of filter 11 as viewed from node n1 inductive. Further, a matching circuit may be disposed between node n23 and the combined circuit of filters 12 and 13 in order to make the input impedance of the combined circuit as viewed from node n23 capacitive.

Note that a divider may be disposed at the connecting point of filter 12 and filter 13 in multiplexer 1 according to this example.

1.7 Impedance Matching of Multiplexer 1B (Third Example of Band Application)

Figure 8A:
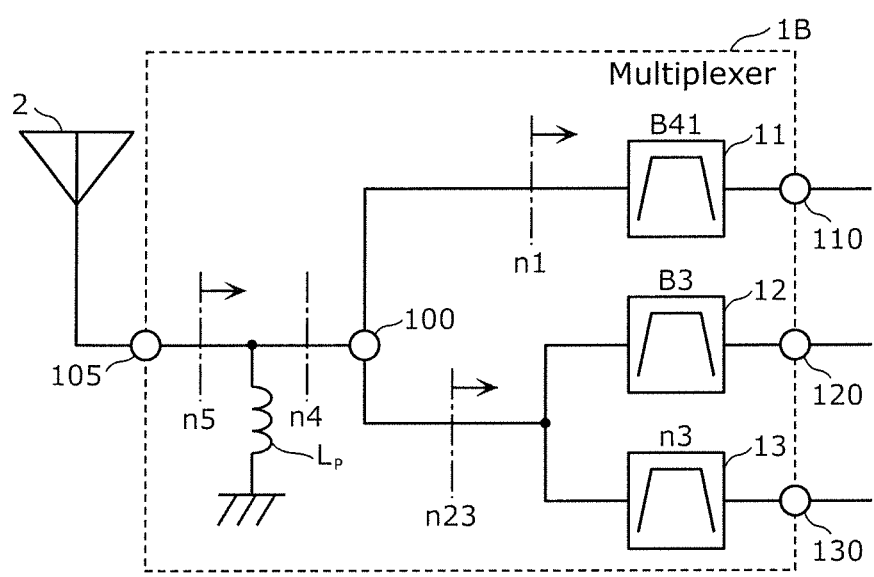
FIG. 8A illustrates an example of a circuit configuration (showing nodes) of the multiplexer according to Variation 2 of Embodiment 1 (with the third example of band application).

FIG. 8A illustrates an example of a circuit configuration (showing nodes) of multiplexer 1B according to Variation 2 of Embodiment 1 with the third example of band application. As the third example of band application, Band 3 for 4G E-UTRA is applied to the first passband of filter 12, n3 for 5G NR is applied to the second passband of filter 13, and Band 41 for 4G E-UTRA is applied to the third passband of filter 11 in multiplexer 1B, in this variation as illustrated in FIG. 8A. In the third example of band application, the first passband of filter 12 and the second passband of filter 13 completely overlap. The third passband of filter 11 does not overlap both the first passband and the second passband.

Figure 8B:
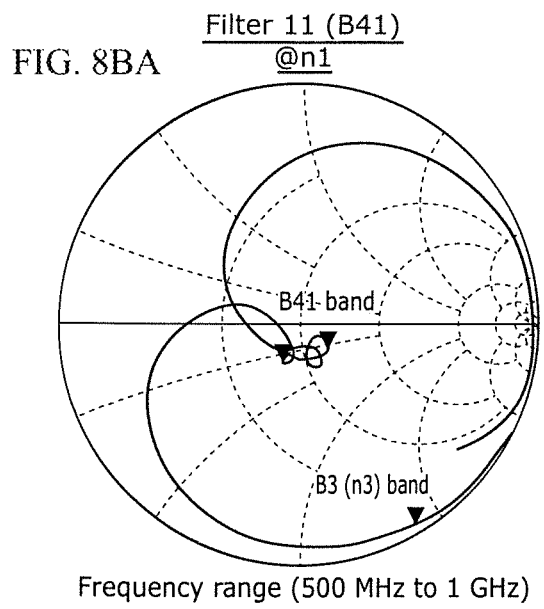
FIGS. 8BA to 8BD illustrate Smith charts showing impedance of the multiplexer according to Variation 2 of Embodiment 1 (in the third example of band application).
Figure 8B:
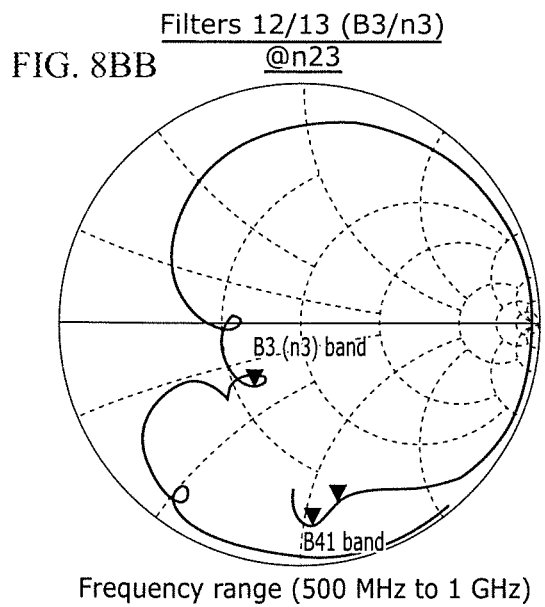
Figure 8B:
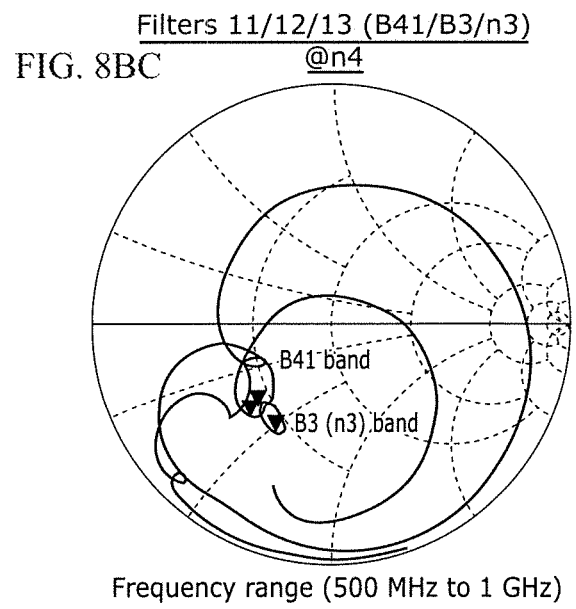
Figure 8B:
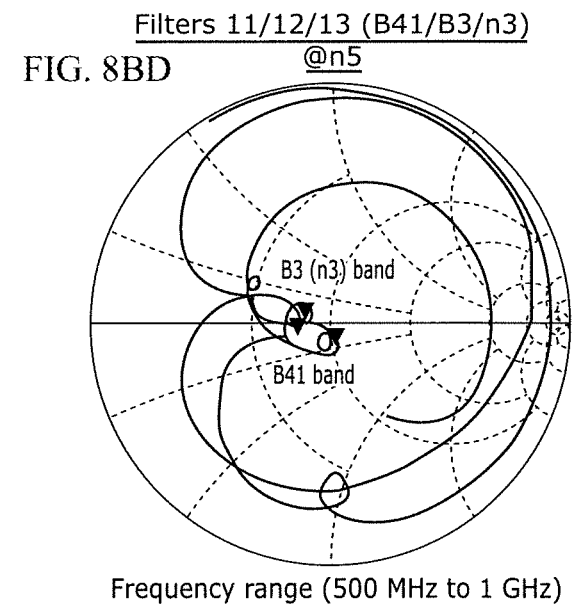

FIGS. 8BA to 8BD illustrate Smith charts showing impedances of multiplexer 1B according to Variation 2 of Embodiment 1 with the third example of band application. FIG. 8BA illustrates the input impedance of filter 11 as viewed from node n1 (illustrated in FIG. 8A). FIG. 8BB illustrates the input impedance of the combined circuit of filters 12 and 13 as viewed from node n23 (illustrated in FIG. 8A). FIG. 8BC illustrates the input impedance of the combined circuit of filters 11 to 13 as viewed from node n4 (illustrated in FIG. 8A). FIG. 8BD illustrates input impedance of multiplexer 1B as viewed from node n5 (illustrated in FIG. 8A).

In FIG. 8BA, the input impedance in the third passband (Band 41), the input impedance in the first passband (Band 3), and the input impedance in the second passband (n3) of filter 11 as viewed from node n1 are located in the capacitive region. In FIG. 8BB, the input impedance in the third passband (Band 41), the input impedance in the first passband (Band 3), and the input impedance in the second passband (n3) of the combined circuit of filters 12 and 13 as viewed from node n23 are located in the capacitive region. Accordingly, in FIG. 8BC, the input impedance in the third passband (Band 41), the input impedance in the first passband (Band 3), and the input impedance in the second passband (n3) of the combined circuit of filters 11 to 13 as viewed from node n4 are located in the capacitive region, and are concentrated in particularly the third quadrant of the Smith chart. The input impedance of the combined circuit of filters 11 to 13 as viewed from node n4 shifts counterclockwise on the equiconductance circle on the admittance chart due to inductor $L_P$. Thus, as can be seen from (d) of FIG. 8B, the input impedance of multiplexer 1B as viewed from node n5 is matched to impedance close to a reference impedance (for example, 50Ω).

Thus, the input impedance of filter 11 having a passband that does not overlap the passbands of filters 12 and 13, and the input impedance of the combined circuit of filters 12 and 13 having completely overlapping passbands are both located in the capacitive region or in the inductive region. Accordingly, impedance matching can be achieved for the input impedance of multiplexer 1B by disposing an impedance matching element between antenna common terminal 105 and common terminal 100.

Figure 8C:
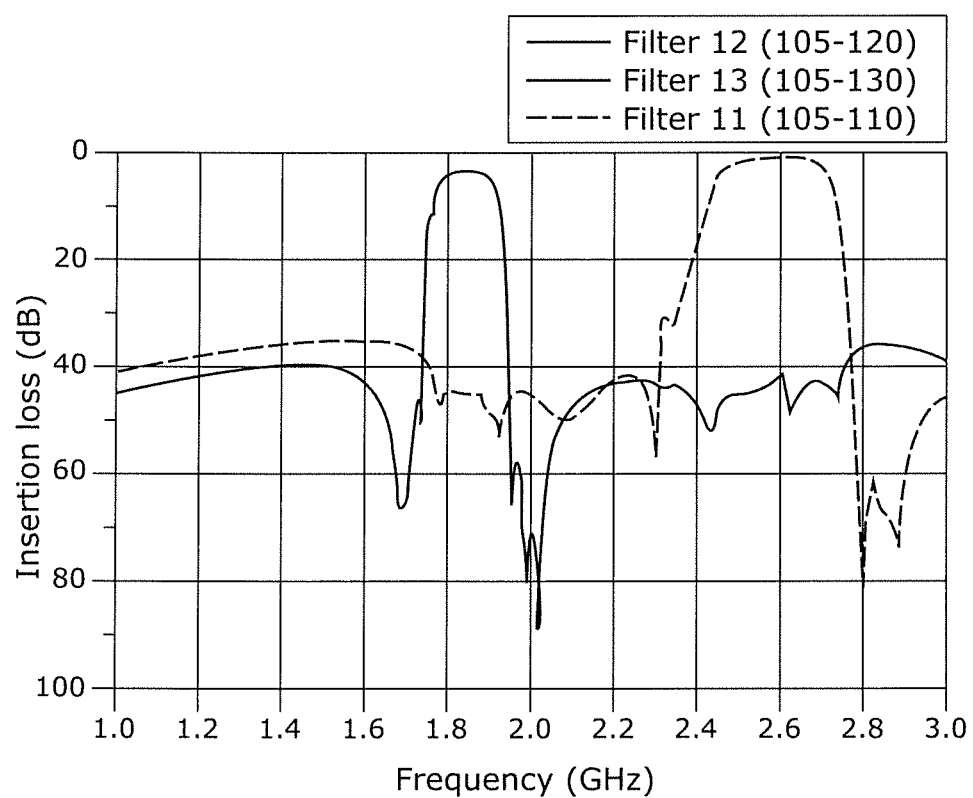
FIG. 8C illustrates a graph showing passing characteristics of the filters in the multiplexer according to Variation 2 of Embodiment 1 with the third example of band application).

FIG. 8C illustrates a graph showing passing characteristics of filters 11 to 13 in multiplexer 1B according to Variation 2 of Embodiment 1 with the third example of band application. The impedance matching achieved by concentration in the capacitive region as described above achieves decrease in loss in the passbands and increase in attenuations in the attenuation bands of filters 11 to 13, as illustrated in FIG. 8C. Thus, a 4G radio frequency signal that passes through filter 11, a 4G radio frequency signal that passes through filter 12, and a 5G radio frequency signal that passes through filter 13 can be simultaneously transferred while low loss and high isolation are achieved.

Note that in this variation, a 4G (Band 3) radio frequency signal and a 5G (n3) radio frequency signal that have completely overlapping frequency bands can be simultaneously transferred (using EN-DC) while low loss and high isolation are ensured.

1.8 Impedance Matching of Multiplexer 1D (Third Example of Band Application)

Figure 9A:
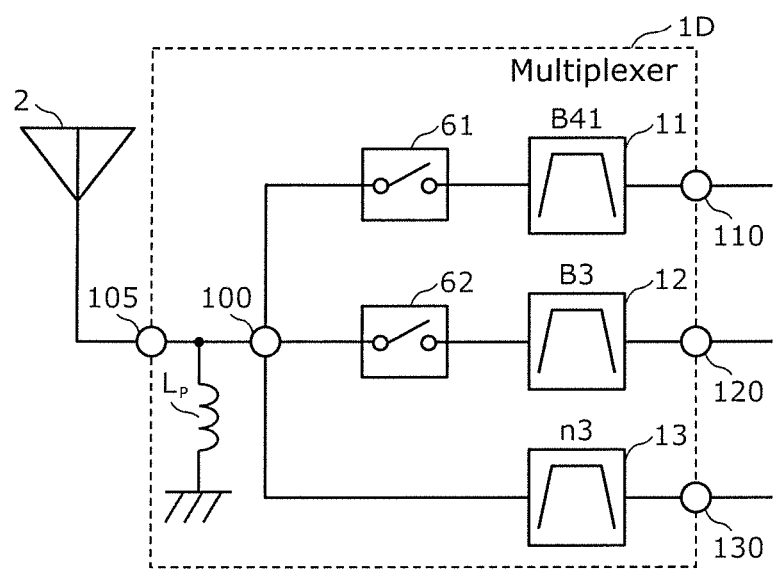
FIG. 9A illustrates a circuit configuration of a multiplexer according to Variation 4 of Embodiment 1 (in the third example of band application).

FIG. 9A illustrates a circuit configuration of multiplexer 1D according to Variation 4 of Embodiment 1 with the third example of band application. As illustrated in FIG. 9A, multiplexer 1D according to this variation includes common terminal 100, filters 11, 12, and 13, switches 61 and 62, inductor $L_P$, antenna common terminal 105, and receiving output terminals 110, 120, and 130. Multiplexer 1D according to this variation is different from multiplexer 1 according to Embodiment 1 in that switches 61 and 62, inductor $L_P$, and antenna common terminal 105 are added. The following describes multiplexer 1D according to this variation, focusing on differences from multiplexer 1 according to Embodiment 1.

Switch 61 is a switch circuit disposed between common terminal 100 and filter 11. Switch 62 is a switch circuit disposed between common terminal 100 and filter 12. Note that a switch as above may be further disposed between common terminal 100 and filter 13.

Antenna common terminal 105 is connected to common terminal 100 and antenna 2. Inductor $L_P$ is an impedance matching element connected between the ground and the connection node of common terminal 100 and antenna common terminal 105. Note that inductor $L_P$ may be disposed in series on a path that connects common terminal 100 and antenna common terminal 105. A capacitor may be disposed instead of inductor $L_P$, or alternatively, a matching circuit that includes at least one inductor and/or at least one capacitor may be disposed.

In this variation, Band 3 for 4G E-UTRA is applied to the first passband of filter 12, n3 for 5G NR is applied to the second passband of filter 13, and Band 41 for 4G E-UTRA is applied to the third passband of filter 11 in multiplexer 1D, as the third example of band application. In the third example of band application, the first passband of filter 12 and the second passband of filter 13 completely overlap. The third passband of filter 11 does not overlap both the first passband and the second passband.

In the above configuration and the above examples of application, when a 4G radio frequency signal that passes through filter 12 and a 5G radio frequency signal that passes through filter 13 are simultaneously transferred (using EN-DC), switch 62 is placed in the conducting state, and switch 61 is placed in the non-conducting state. Further, when a 4G radio frequency signal that passes through filter 11 and a 5G radio frequency signal that passes through filter 13 are simultaneously transferred (using EN-DC), switch 61 is placed in the conducting state, and switch 62 is placed in the non-conducting state. When a 4G radio frequency signal that passes through filter 11, a 4G radio frequency signal that passes through filter 12, and a 5G radio frequency signal that passes through filter 13 are simultaneously transferred (using EN-DC), switch 61 is placed in the conducting state, and switch 62 is placed in the conducting state. When only a 5G radio frequency signal that passes through filter 13 is transferred, switches 61 and 62 are placed in the non-conducting state.

Thus, placing switch 61 in the non-conducting state improves isolation of filter 11, upstream of which switch 61 is disposed, with respect to filters 12 and 13. Further, placing switch 62 in the non-conducting state improves isolation of filter 12, upstream of which switch 62 is disposed, with respect to filters 11 and 13. Accordingly, this improves passing characteristics of multiplexer 1D.

Figure 9B:
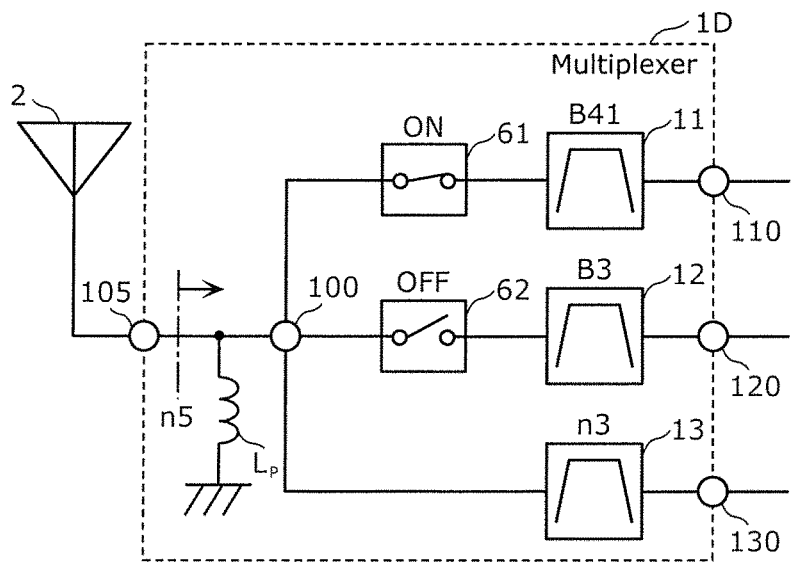
FIG. 9BA illustrates a circuit configuration in a first switch state, FIG. 9BB illustrates a graph showing passing characteristics of the filters, and FIG. 9BC illustrates a Smith chart showing impedance of the multiplexer according to Variation 4 of Embodiment 1 (in the third example of band application).
Figure 9B:
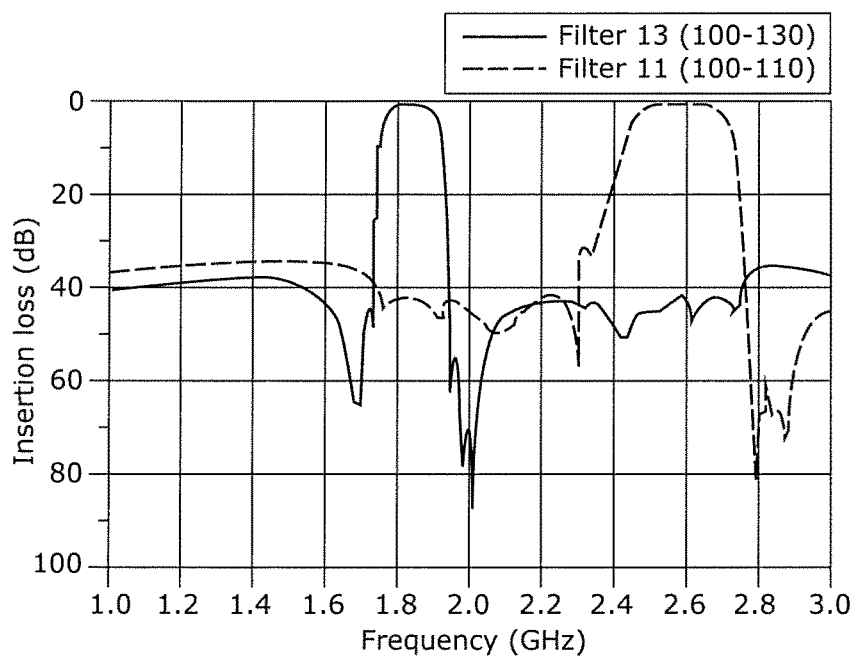
Figure 9B:
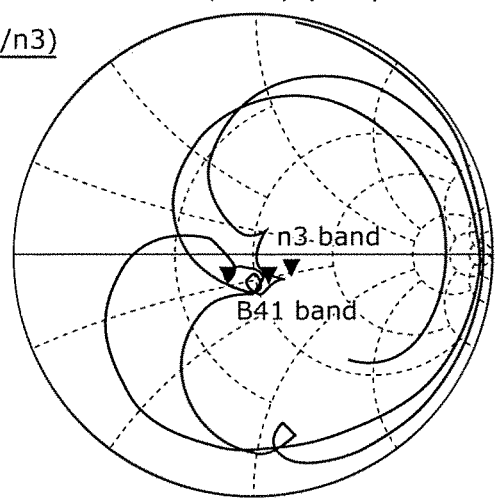

FIG. 9BA illustrates a circuit configuration in a first switch state, FIG. 9BB illustrates a graph showing passing characteristics of the filters FIG. 9BC illustrates a Smith chart showing an impedance of multiplexer 1D according to Variation 4 of Embodiment 1 with the third example of band application. FIGS. 9BA to 9BC illustrate passing characteristics and impedance matching when a 4G (Band 41) radio frequency signal that passes through filter 11 and a 5G (n3) radio frequency signal that passes through filter 13 are simultaneously transferred (using EN-DC) in multiplexer 1D. In this case, switch 61 is placed in the conducting state, and switch 62 is placed in the non-conducting state (the first switch state).

In this case, the input impedance of filter 11 alone as viewed from common terminal 100 is capacitive. On the other hand, the input impedance of filter 13 alone as viewed from common terminal 100 is capacitive. Specifically, the input impedance of filter 11 and input impedance of filter 13 are both capacitive, and are concentrated in particularly the third quadrant of the Smith chart. The input impedance of the combined circuit of filters 11 and 13 as viewed from common terminal 100 shifts counterclockwise on the equiconductance circle on the admittance chart due to inductor $L_P$. Accordingly, as can be seen from FIG. 9BC, the input impedance in the second passband (n3) and input impedance in the third passband (Band 41) of multiplexer 1D as viewed from node n5 are matched to impedance close to a reference impedance (for example, 50Ω).

FIG. 9BB illustrates a graph showing passing characteristics of filters 11 and 13 in multiplexer 1D in the first switch state. The impedance matching achieved by concentration in the capacitive region described above achieves decrease in loss in the passbands and increase in the attenuations in the attenuation bands of filters 11 and 13. Accordingly, a 4G radio frequency signal that passes through filter 11 and a 5G radio frequency signal that passes through filter 13 can be simultaneously transferred while low loss and high isolation are achieved.

Figure 9C:
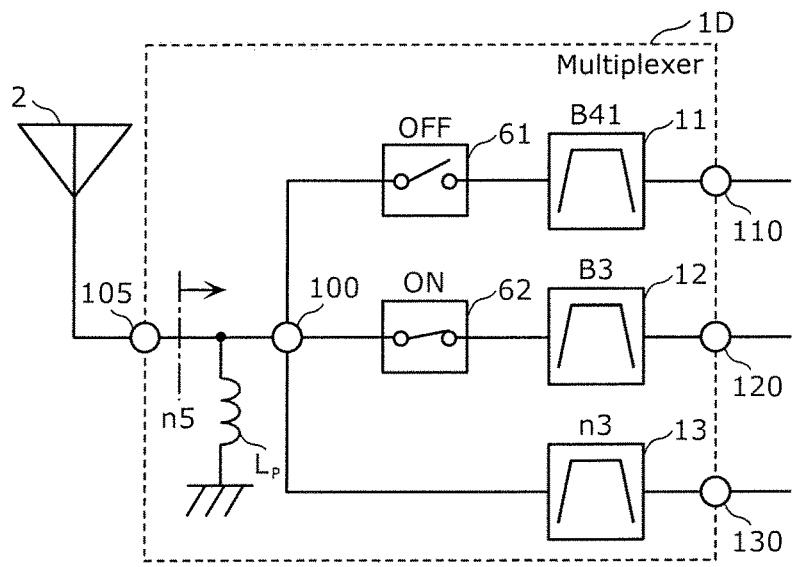
FIG. 9CA illustrates an example of a circuit configuration in a second switch state, FIG. 9CB illustrates a graph showing passing characteristics of the filters, and FIG. 9CC illustrates a Smith chart showing impedance of the multiplexer according to Variation 4 of Embodiment 1 (in the third example of band application).
Figure 9C:
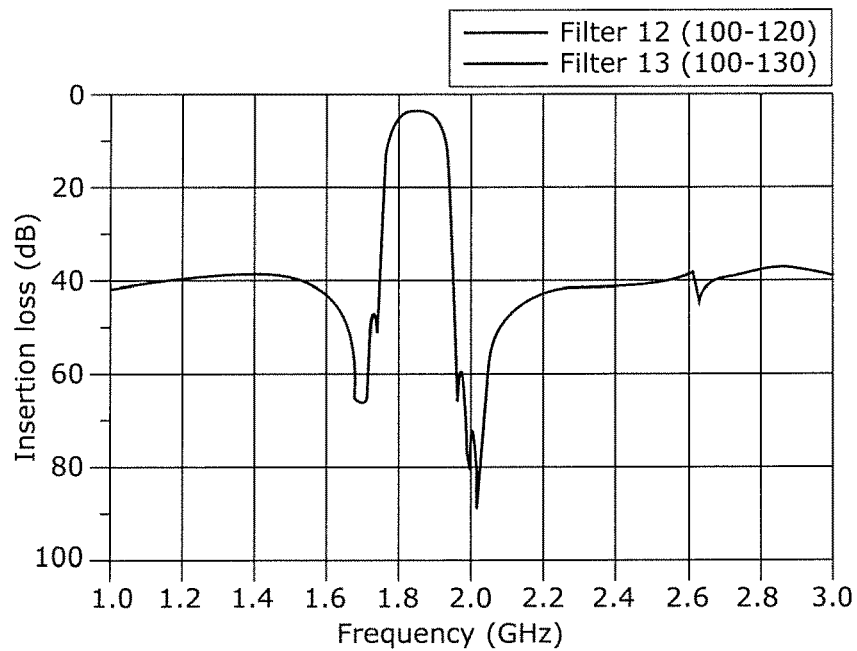
Figure 9C:
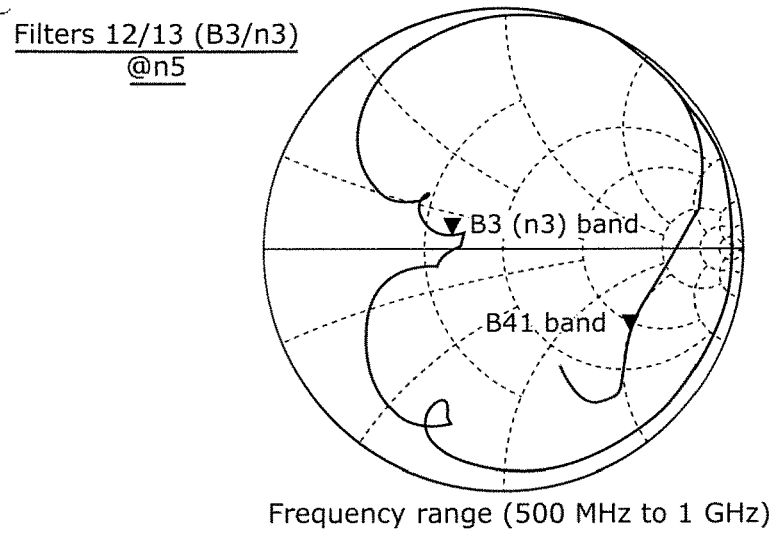

FIG. 9CA illustrates an example of a circuit configuration in a second switch state, FIG. 9CB illustrates a graph showing passing characteristics of the filters, FIG. 9CC illustrates a Smith chart showing an impedance of multiplexer 1D according to Variation 4 of Embodiment 1 with the third example of band application. FIGS. 9CA to 9CC illustrates passing characteristics and impedance matching when a 4G (Band 3) radio frequency signal that passes through filter 12 and a 5G (n3) radio frequency signal that passes through filter 13 are simultaneously transferred (using EN-DC) in multiplexer 1D. In this case, switch 61 is placed in the non-conducting state, and switch 62 is placed in the conducting state (the second switch state).

In this case, for example, input impedance of filter 12 alone as viewed from common terminal 100 is capacitive. On the other hand, the input impedance of filter 13 alone as viewed from common terminal 100 is capacitive. Specifically, input impedance of filter 12 and the input impedance of filter 13 are both capacitive, and are concentrated in particularly the third quadrant of the Smith chart. The input impedance of the combined circuit of filters 12 and 13 as viewed from common terminal 100 shifts counterclockwise on the equiconductance circle on the admittance chart due to inductor $L_P$. Accordingly, as can be seen from FIG. 9CC, the input impedance in the first passband (Band 3)/the second passband (n3) of multiplexer 1D as viewed from node n5 is matched to the impedance close to a reference impedance (for example, 50Ω).

FIG. 9CB illustrates a graph showing passing characteristics of filters 12 and 13 in multiplexer 1D in the second switch state. The impedance matching achieved by concentration in the capacitive region described above achieves decrease in loss in the passbands and increase in the attenuations in the attenuation bands in filters 12 and 13. Accordingly, a 4G radio frequency signal that passes through filter 12 and a 5G radio frequency signal that passes through filter 13 can be simultaneously transferred while low loss and high isolation are achieved.

1.9 Impedance Matching of Multiplexer 1E (Fourth Example of Band Application)

Figure 10A:
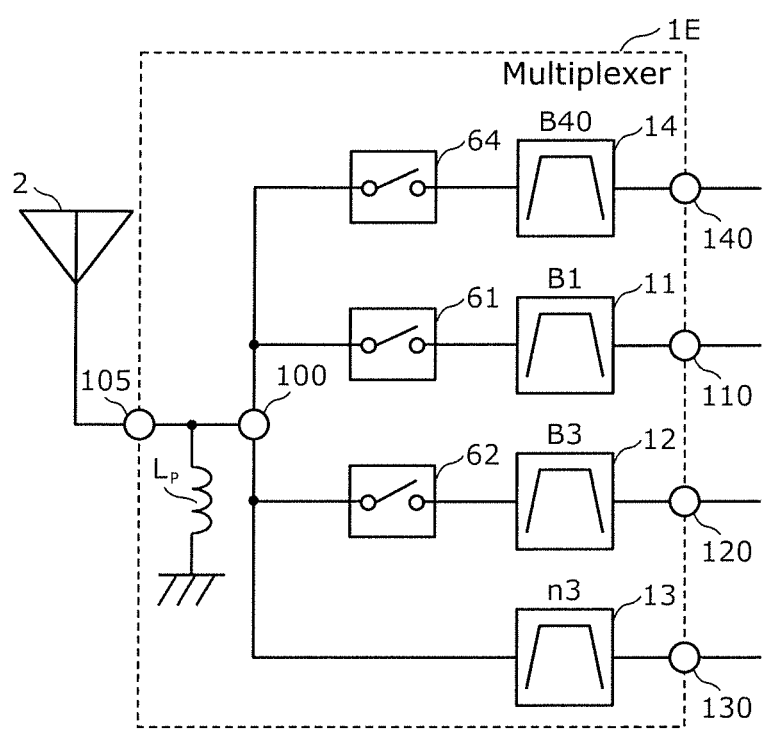
FIG. 10A illustrates a circuit configuration of a multiplexer according to Variation 5 of Embodiment 1 (in a fourth example of band application).

FIG. 10A illustrates a circuit configuration of multiplexer 1E according to Variation 5 of Embodiment 1 with a fourth example of band application. As illustrated in FIG. 10A, multiplexer 1E according to this variation includes common terminal 100, filters 11, 12, 13, and 14, switches 61, 62, and 64, inductor $L_P$, antenna common terminal 105, and receiving output terminals 110, 120, 130, and 140. Multiplexer 1E according to this variation is different from multiplexer 1C according to Variation 3 of Embodiment 1 in that switches 61, 62, and 64, inductor $L_P$, and antenna common terminal 105 are added. The following describes multiplexer 1E according to this variation, focusing on differences from multiplexer 1C according to Variation 3 of Embodiment 1.

Switch 61 is a switch circuit disposed between common terminal 100 and filter 11. Switch 62 is a switch circuit disposed between common terminal 100 and filter 12. Switch 64 is a switch circuit disposed between common terminal 100 and filter 14. Note that such a switch may be further disposed between common terminal 100 and filter 13.

Antenna common terminal 105 is connected to common terminal 100 and antenna 2. Inductor $L_P$ is an impedance matching element connected between the ground and the connection node of common terminal 100 and antenna common terminal 105. Note that inductor $L_P$ may be disposed in series on a path that connects common terminal 100 and antenna common terminal 105. A capacitor may be disposed instead of inductor $L_P$, or furthermore a matching circuit that includes at least one inductor and/or at least one capacitor may be disposed.

In this variation, Band 3 for 4G E-UTRA is applied to the first passband of filter 12, n3 for 5G NR is applied to the second passband of filter 13, Band 1 (receiving band: 2110 MHz to 2170 MHz) for 4G E-UTRA is applied to the third passband of filter 11, and Band 40 (band: 2300 MHz to 2400 MHz) for 4G E-UTRA is applied to the fourth passband of filter 14 in multiplexer 1E, as the fourth example of band application. In the fourth example of band application, the first passband of filter 12 and the second passband of filter 13 completely overlap. The third passband of filter 11 does not overlap both the first passband and the second passband. The fourth passband of filter 14 does not overlap all the first passband, the second passband, and the third passband.

In the configuration and the examples of application, a 4G radio frequency signal that passes through filter 11, a 5G radio frequency signal that passes through filter 13, and a 4G radio frequency signal that passes through filter 14 are simultaneously transferred (using EN-DC), switches 61 and 64 are placed in the conducting state, and switch 62 is placed in the non-conducting state (the first switch state). When a 4G radio frequency signal that passes through filter 12 and a 5G radio frequency signal that passes through filter 13 are simultaneously transferred (using EN-DC), switch 62 is placed in the conducting state, and switches 61 and 64 are placed in the non-conducting state (the second switch state). When a 4G radio frequency signal that passes through filter 11, a 4G radio frequency signal that passes through filter 12, a 5G radio frequency signal that passes through filter 13, and a 4G radio frequency signal that passes through filter 14 are simultaneously transferred (using EN-DC), switches 61, 62, and 64 are placed in the conducting state. When only a 5G radio frequency signal that passes through filter 13 is transferred, switches 61, 62, and 64 are placed in the non-conducting state.

Specifically, placing switch 61 in the non-conducting state improves isolation of filter 11, upstream of which switch 61 is disposed, with respect to filters 12, 13, and 14. Placing switch 62 in the non-conducting state improves isolation of filter 12, upstream of which switch 62 is disposed, with respect to filters 11, 13, and 14. Placing switch 64 in the non-conducting state improves isolation of filter 14, upstream of which switch 64 is disposed, with respect to filters 11, 12, and 13. Accordingly, passing characteristics of multiplexer 1E can be improved.

Figure 10B:
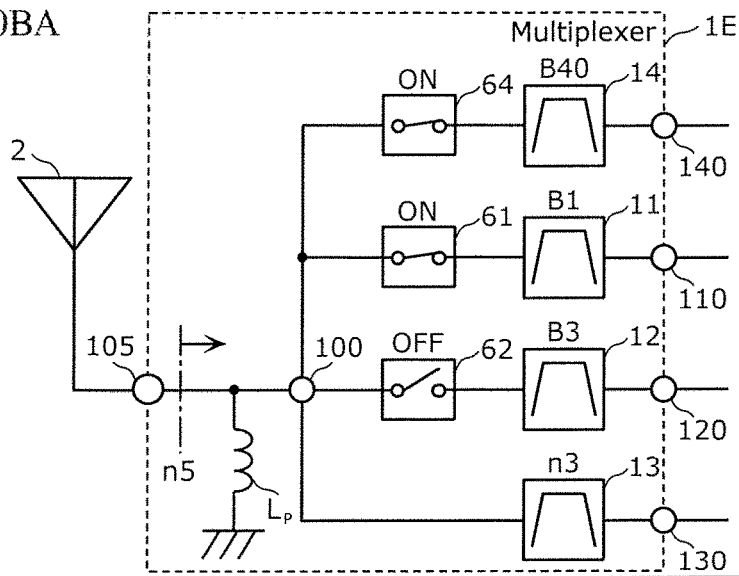
FIG. 10BA illustrates a circuit configuration in the first switch state, FIG. 10BB illustrates a graph showing passing characteristics of the filters, and FIG. 10BC illustrates a Smith chart showing impedance of the multiplexer according to Variation 5 of Embodiment 1 (in the fourth example of band application).
Figure 10B:
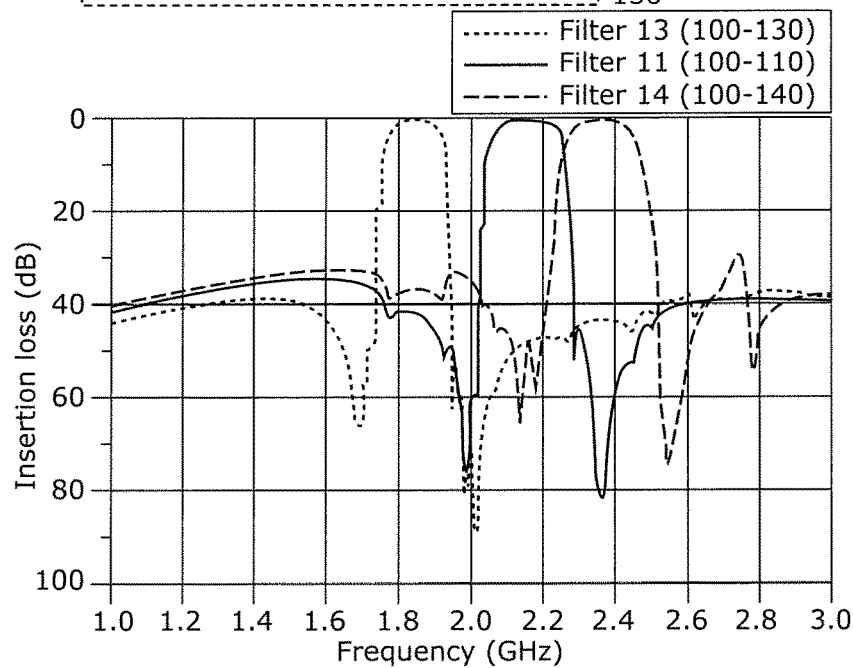
Figure 10B:
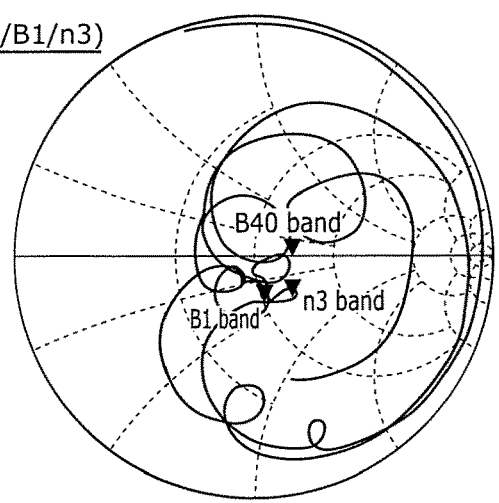

FIG. 10BA illustrates an example of a circuit configuration in the first switch state, FIG. 10BB illustrates a graph showing passing characteristics of the filters, and FIG. 10BC illustrates a Smith chart showing an impedance of multiplexer 1E according to Variation 5 of Embodiment 1 with the fourth example of band application. FIGS. 10BA to 10BC illustrate passing characteristics and impedance matching when a 4G (Band 41) radio frequency signal that passes through filter 11, a 5G (n3) radio frequency signal that passes through filter 13, and a 4G (Band 40) radio frequency signal that passes through filter 14 are simultaneously transferred (using EN-DC) in multiplexer 1E. In this case, switches 61 and 64 are placed in the conducting state, and switch 62 is placed in the non-conducting state (the first switch state).

In this case, input impedance of filter 11 alone as viewed from common terminal 100 is capacitive. On the other hand, input impedance of filter 14 alone as viewed from common terminal 100 is capacitive. Further, input impedance of filter 13 alone as viewed from common terminal 100 is capacitive. Specifically, input impedance of filter 11, input impedance of filter 14, and input impedance of filter 13 are all capacitive, and are concentrated in particularly the third quadrant of the Smith chart. Input impedance of the combined circuit of filters 11, 13, and 14 as viewed from common terminal 100 shifts counterclockwise on the equiconductance circle on the admittance chart due to inductor $L_P$. Accordingly, as can be seen from FIG. 10BC, input impedance in the second passband (n3), input impedance in the third passband (Band 1), and input impedance in the fourth passband (Band 40) of multiplexer 1E as viewed from node n5 are each matched to impedance close to reference impedance (for example, 50Ω).

FIG. 10BB illustrates a graph showing passing characteristics of filters 11, 13, and 14 in multiplexer 1E in the first switch state. The impedance matching achieved by concentration in the capacitive region described above achieves decrease in loss in the passbands and increase in the attenuations in the attenuation bands of filters 11, 13, and 14. Accordingly, a 4G radio frequency signal that passes through filter 11, a 5G radio frequency signal that passes through filter 13, and a 4G radio frequency signal that passes through filter 14 can be simultaneously transferred while low loss and high isolation are achieved.

Figure 10C:
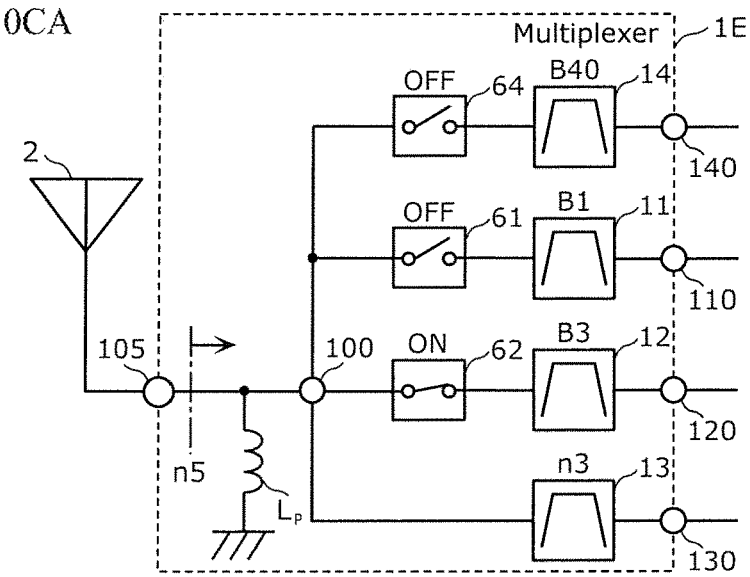
FIG. 10CA illustrates an example of a circuit configuration in the second switch state, FIG. 10CB illustrates a graph showing passing characteristics of the filters, and FIG. 10CC illustrates a Smith chart showing impedance of the multiplexer according to Variation 5 of Embodiment 1 (in the fourth example of band application).
Figure 10C:
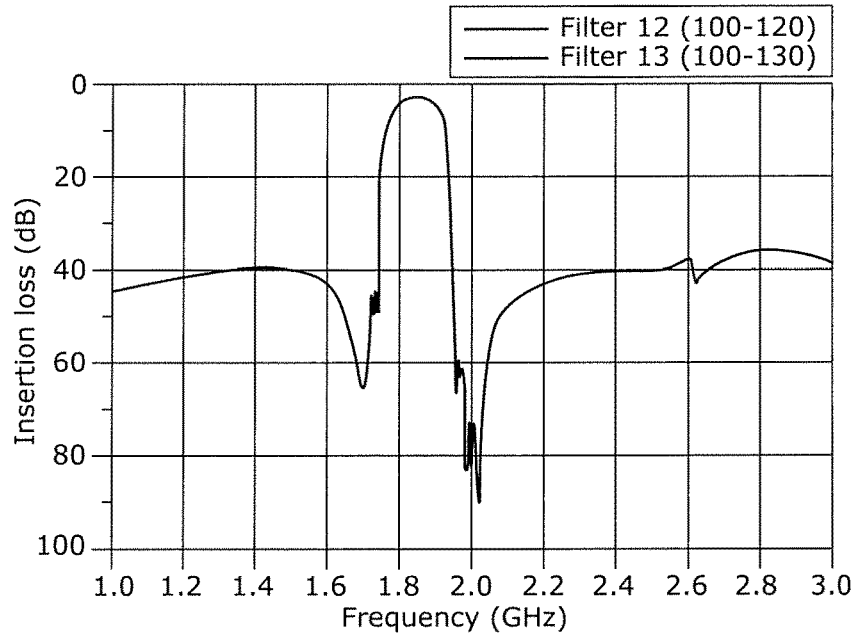
Figure 10C:
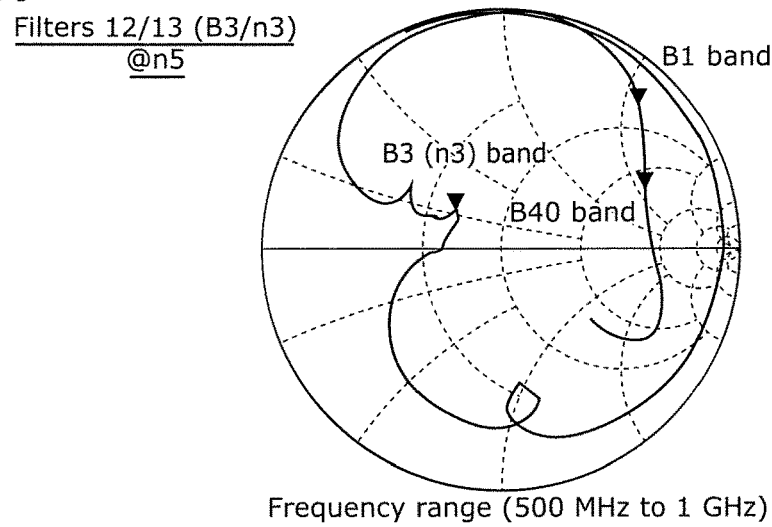

FIG. 10CA illustrates a circuit configuration in the second switch state, FIG. 10CB illustrates a graph showing passing characteristics of the filters, and FIG. 10CC illustrates a Smith chart showing an impedance of multiplexer 1E according to Variation 5 of Embodiment 1 with the fourth example of band application. FIGS. 10CB and 10CC illustrate passing characteristics and impedance matching when a 4G (Band 3) radio frequency signal that passes through filter 12, and a 5G (n3) radio frequency signal that passes through filter 13 are simultaneously transferred (using EN-DC) in multiplexer 1E. In this case, switches 61 and 64 are placed in the non-conducting state, and switch 62 is placed in the conducting state (the second switch state).

In this case, for example, input impedance of filter 12 alone as viewed from common terminal 100 is capacitive. Further, the input impedance of filter 13 alone as viewed from common terminal 100 is capacitive. Specifically, the input impedance of filter 12 and the input impedance of filter 13 are both capacitive, and are concentrated in particularly the third quadrant of the Smith chart. The input impedance of the combined circuit of filters 12 and 13 as viewed from common terminal 100 shifts counterclockwise on the equiconductance circle on the admittance chart due to inductor $L_P$. Accordingly, as can be seen from FIG. 10CC, the input impedance in the first passband (Band 3)/the second passband (n3) of multiplexer 1E as viewed from node n5 is matched to impedance close to reference impedance (for example, 50Ω).

FIG. 10CC illustrates a graph showing passing characteristics of filters 12 and 13 in multiplexer 1E in the second switch state. The impedance matching achieved by concentration in the capacitive region described above achieves decrease in loss in the passbands and increase in the attenuations in the attenuation bands in filters 12 and 13. Accordingly, a 4G radio frequency signal that passes through filter 12 and a 5G radio frequency signal that passes through filter 13 can be simultaneously transferred while low loss and high isolation are achieved.

As described above, according to the above embodiments, multiplexer 1 includes: common terminal 100; filter 12 configured to be connected to common terminal 100, and having a first passband; filter 13 configured to be connected to common terminal 100, and having a second passband that at least partially overlaps the first passband; and filter 11 configured to be connected to common terminal 100, and having a third passband that does not overlap both the first passband and the second passband.

According to this configuration, two or more radio frequency signals having overlapping frequency ranges can be simultaneously transferred using the filters connected to common terminal 100. Accordingly, it is not necessary to dispose circuit elements such as antennas and switches, based on the number of radio frequency signals that are simultaneously transferred, and thus miniaturized multiplexer 1 that can simultaneously transfer a plurality of radio frequency signals can be provided.

When filter 12 and filter 13 are viewed from common terminal 100 in a state in which filter 12 and filter 13 are connected to common terminal 100 and filter 11 is disconnected from common terminal 100, an impedance in the first passband, an impedance in the second passband, and an impedance in the third passband may be located in one of an inductive region and a capacitive region in a Smith chart, and when filter 11 is viewed from common terminal 100 in a state in which filter 12 and filter 13 are disconnected from common terminal 100 and filter 11 is connected to common terminal 100, an impedance in the first passband, an impedance in the second passband, and an impedance in the third passband may be located in another of the inductive region and the capacitive region in a Smith chart.

Accordingly, the impedance of a combined circuit in which filters 12 and 13 having overlapping passbands are connected to common terminal 100 as viewed from common terminal 100 and impedance of filter 11 having a passband that does not overlap the passbands of filters 12 and 13 as viewed from common terminal 100 are in a complex conjugate relation. Thus, a radio frequency signal that passes through filter 12, a radio frequency signal that passes through filter 13, and a radio frequency signal that passes through filter 11 can be simultaneously transferred while low loss and high isolation are achieved.

Common terminal 100 and filter 12 may be connected without a switch provided therebetween, and common terminal 100 and filter 13 may be connected without a switch provided therebetween.

Accordingly, the loss due to on resistance of the switches can be prevented from being added to a radio frequency signal that passes through filter 12 or 13. Further, radio frequency signals can be prevented from being distorted due to the switches.

At least one of filter 12 or filter 13 may be connected to common terminal 100 via switch 62.

Accordingly, when a radio frequency signal that passes through filter 12 and a radio frequency signal that passes through filter 13 are to be simultaneously transferred, common terminal 100 and filter 12 can be connected by placing switch 62 in the conducting state while common terminal 100 and filter 13 are connected. Further, when a radio frequency signal that passes through filter 12 is prevented from being transferred and a radio frequency signal that passes through filter 13 is allowed to be transferred, common terminal 100 and filter 12 can be disconnected by placing switch 62 in the non-conducting state while common terminal 100 and filter 13 are connected. Thus, placing switch 62 in the non-conducting state improves isolation of filter 12, upstream of which switch 62 is disposed, with respect to filters 11 and 13, upstream of which no switches are disposed. Consequently, this improves passing characteristics of multiplexer 1A.

Common terminal 100 and filter 11 may be connected without a switch provided therebetween.

In simultaneous transfer of a radio frequency signal that passes through filter 12 and a radio frequency signal that passes through filter 13, even if filter 11 having a passband that does not overlap the passbands of filters 12 and 13 is connected to common terminal 100, such a state does not affect simultaneous transfer of the two radio frequency signals. Accordingly, no switch is necessary between filter 11 and common terminal 100, and thus multiplexer 1 can be miniaturized.

Multiplexer 1 may further include filter 14 configured to be connected to common terminal 100, and having a fourth passband that does not overlap all the first passband, the second passband, and the third passband.

Accordingly, in multiplexer 1C, a radio frequency signal that passes through filter 12, a radio frequency signal that passes through filter 13, a radio frequency signal that passes through filter 11, and a radio frequency signal that passes through filter 14 can be simultaneously transferred while low loss and high isolation are achieved.

A radio frequency signal used in a fourth generation mobile communication system (4G) may pass through filter 12, and a radio frequency signal used in a fifth generation mobile communication system (5G) may pass through filter 13.

Accordingly, this achieves simultaneous transfer (using EN-DC) for 4G and 5G for which low loss and high isolation are ensured.

The first passband may be Band 20 for Evolved Universal Terrestrial Radio Access (E-UTRA), the second passband may be n28 for New Radio (NR), and the third passband may be Band 5 for E-UTRA.

Accordingly, radio frequency signals having frequency ranges in Band 20 for E-UTRA and n28 for NR that partially overlap can be simultaneously transferred (using EN-DC) while low loss and high isolation are achieved.

The first passband may be Band 3 for Evolved Universal Terrestrial Radio Access (E-UTRA), the second passband may be n3 for New Radio (NR), and the third passband may be Band 41 for E-UTRA.

Accordingly, radio frequency signals having frequency ranges in Band 3 for E-UTRA and n3 for NR that completely overlap can be simultaneously transferred (using EN-DC) while low loss and high isolation are achieved.

Communication device 6 includes RFIC 4 configured to process a radio frequency signal transmitted by antenna 2 and a radio frequency signal received by antenna 2; and multiplexer 1 configured to transfer the radio frequency signals between antenna 2 and RFIC 4.

Accordingly, miniaturized communication device 6 that can simultaneously transfer a plurality of radio frequency signals can be provided.

Communication device 6 may further include: receiving amplifier 31 configured to be connected to filter 12, and amplify a radio frequency signal having a frequency range in the first passband; receiving amplifier 32 configured to be connected to filter 13, and amplify a radio frequency signal having a frequency range in the second passband; and receiving amplifier 33 configured to be connected to filter 11, and amplify a radio frequency signal having a frequency range in the third passband.

Accordingly, miniaturized communication device 6 in which multiplexer 1 is used as an antenna front end circuit can be provided.

Embodiment 2

Embodiment 1 has described an example of a configuration of a multiplexer connected to antenna 2, yet Embodiment 2 will describe a configuration of a multiplexer disposed downstream of a diplexer and an amplifier.

Figure 11:
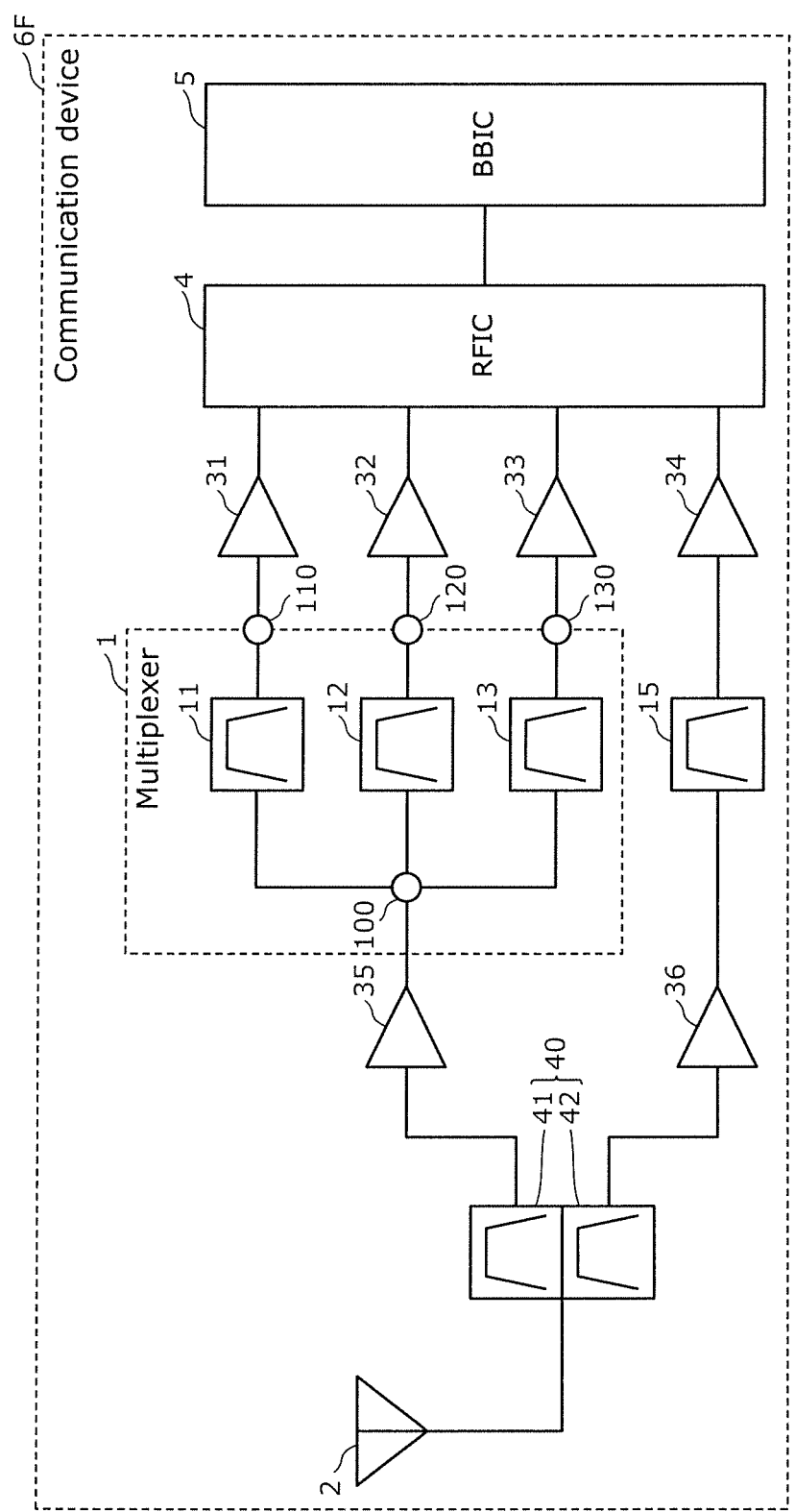
FIG. 11 illustrates a circuit configuration of the multiplexer and a communication device according to Embodiment 2.

FIG. 11 illustrates an example of a circuit configuration of multiplexer 1 and communication device 6F according to Embodiment 2. As illustrated in FIG. 11, communication device 6F includes multiplexer 1, antenna 2, diplexer 40, receiving amplifiers 31, 32, 33, 34, 35, and 36, filter 15, RFIC 4, and BBIC 5. Communication device 6F according to the present embodiment is different from communication device 6 according to Embodiment 1 in that diplexer 40, receiving amplifiers 34 to 36, and filter 15 are added, and in the position where multiplexer 1 is disposed. In the following, a description of a configuration of communication device 6F according to the present embodiment that is the same as the configuration of communication device 6 according to Embodiment 1 is omitted, and a different configuration is mainly described.

Diplexer 40 includes filters 41 and 42. Diplexer 40 includes an input terminal connected to antenna 2. Filter 41 is, for example, a low-pass filter having a passband lower than the passband of filter 42, and the passband of filter 41 includes a plurality of communication bands each lower than a predetermined frequency. Filter 42 is, for example, a high-pass filter having a passband higher than the passband of filter 41, and the passband of filter 42 includes a plurality of communication bands each higher than the predetermined frequency.

Note that the filters included in diplexer 40 are not limited to a low-pass filter and a high-pass filter, and may be bandpass filters having predetermined passbands. Diplexer 40 may be a multiplexer that includes three or more filters.

Any of the following may be applied to the passbands of filters 41 and 42 included in diplexer 40: a wireless LAN (2.4 GHz), a wireless LAN (5 GHz) that includes LTE Band 46 and LTE Band 47, a low band group (617 MHz to 960 MHz), GPS (registered trademark) L1 (1559 MHz to 1606 MHz), GPS L5 (1166 MHz to 1229 MHz), a middle band group (1427 MHz to 2200 MHz), a high band group (2300 MHz to 2690 MHz), and an ultra-high band group (3300 MHz to 4990 MHz).

Receiving amplifier 35 is an example of a fourth low noise amplifier, and includes an input terminal connected to filter 41, and an output terminal connected to common terminal 100 of multiplexer 1. Receiving amplifier 35 amplifies radio frequency signals having frequency ranges in the first passband, the second passband, and the third passband.

Receiving amplifier 36 includes an input terminal connected to filter 42, and an output terminal connected to filter 15, and amplifies a radio frequency signal having a frequency range in the passband of filter 42.

Receiving amplifier 34 includes an input terminal connected to filter 15, and an output terminal connected to RFIC 4, and amplifies a radio frequency signal having a frequency range in the passband of filter 42.

Filter 15 is connected between receiving amplifier 36 and receiving amplifier 34, and has a passband included in the passband of filter 42.

According to the above configuration of communication device 6F, two or more radio frequency signals having overlapping frequency ranges can be simultaneously transferred using filters 11 to 13 connected to common terminal 100 in multiplexer 1 disposed downstream of diplexer 40 and receiving amplifier 35. Accordingly, it is not necessary to dispose circuit elements such as antennas and switches according to the number of radio frequency signals that are simultaneously transferred, and thus miniaturized communication device 6F that can simultaneously transfer a plurality of radio frequency signals can be provided.

Embodiment 3

Embodiment 1 illustrates a configuration of the multiplexer connected to antenna 2, whereas Embodiment 3 describes a configuration of a multiplexer disposed between an amplifier and an RFIC.

Figure 12:
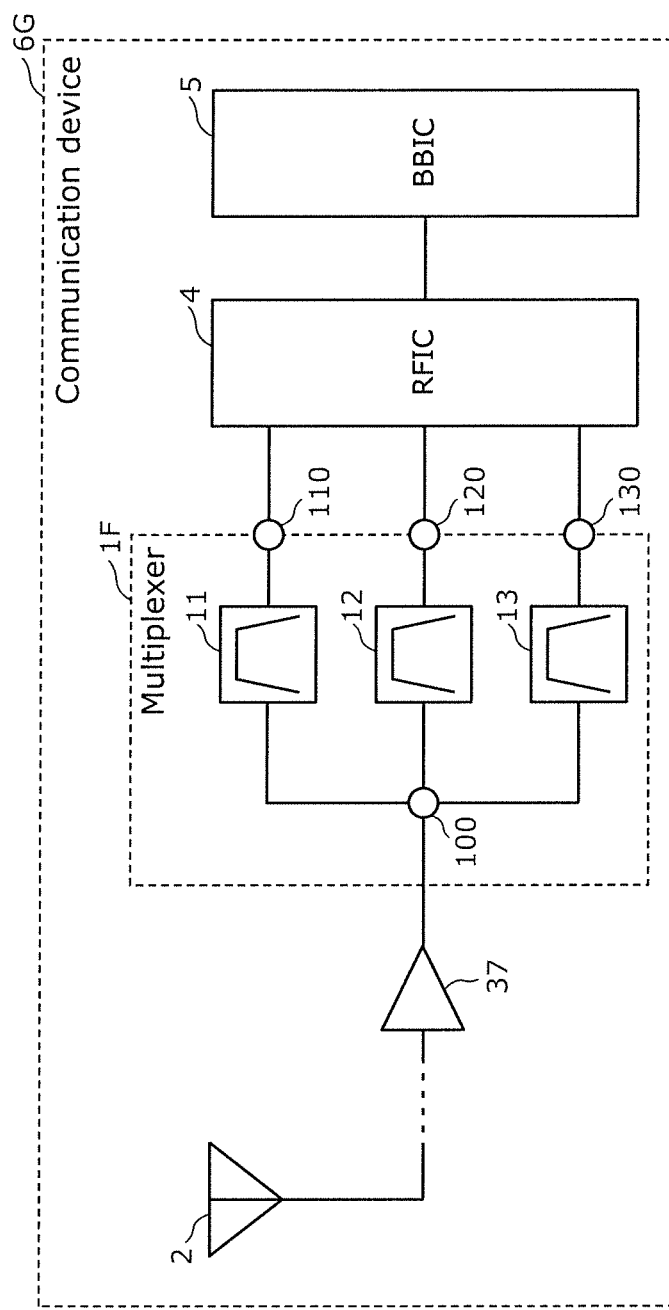
FIG. 12 illustrates a circuit configuration of a multiplexer and a communication device according to Embodiment 3.

FIG. 12 illustrates an example of a circuit configuration of multiplexer 1F and communication device 6G according to Embodiment 3. As illustrated in FIG. 12, communication device 6G includes multiplexer 1F, antenna 2, receiving amplifier 37, RFIC 4, and BBIC 5. Communication device 6G according to the present embodiment is different from communication device 6 according to Embodiment 1 in the position where a receiving amplifier is disposed. In the following, a description of the configuration of communication device 6G according to the present embodiment that is the same as that of communication device 6 according to Embodiment 1 is omitted, and a different configuration is mainly described.

Receiving amplifier 37 is an example of a fifth low noise amplifier, includes an output terminal connected to common terminal 100 of multiplexer 1F, and amplifies radio frequency signals having frequency ranges in the first passband, the second passband, and the third passband.

Note that circuit elements such as a filter, a switch, and a matching circuit may be disposed on a signal path that connects antenna 2 and receiving amplifier 37.

Filter 12 is an example of a first filter having a first passband, and includes an input terminal connected to common terminal 100, and an output terminal connected to RFIC 4.

Filter 13 is an example of a second filter having a second passband, and includes an input terminal connected to common terminal 100, and an output terminal connected to RFIC 4.

Filter 11 is an example of a third filter having a third passband, and includes an input terminal connected to common terminal 100, and an output terminal connected to RFIC 4.

According to the configuration of communication device 6G, in multiplexer 1F disposed downstream of receiving amplifier 37, two or more radio frequency signals having overlapping frequency ranges can be simultaneously transferred using filters 11 to 13 connected to common terminal 100.

Conventionally, signals output from receiving amplifier 37 are transferred to an RFIC via a distributor, for instance, and the signals output from the distributor are attenuated by 3 dB, for example. In contrast, according to communication device 6G according to the present embodiment, multiplexer 1F is disposed instead of the distributor, and thus an unnecessary signal can be attenuated, and a desired signal is allowed to pass through while low loss is achieved.

Other Embodiments

The above has described the multiplexer and the communication device according to the present disclosure using the embodiments and variations thereof, yet the present disclosure is not limited to the above embodiments and variations thereof. The present disclosure also encompasses another embodiment achieved by combining arbitrary elements in the above embodiments and variations thereof, variations as a result of applying various modifications that may be conceived by those skilled in the art to the embodiments and variations thereof without departing from the scope of the present disclosure, and various devices that include the multiplexer and the communication device according to the present disclosure.

For example, in the multiplexer and the communication device according to the above embodiments and variations thereof, at least one matching element such as an inductor and/or a capacitor, and a switch circuit may be connected between elements. Note that the inductor may include a line inductor achieved by a line that connects elements.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

The present disclosure can be widely used for communication apparatuses such as mobile phones, as a multiplexer applicable to a multi-band system, and a communication device.

The invention claimed is:

1. A multiplexer, comprising:
   a common terminal;
   a first filter configured to be connected to the common terminal, and having a first passband;
   a second filter configured to be connected to the common terminal, and having a second passband that at least partially overlaps the first passband; and
   a third filter configured to be connected to the common terminal, and having a third passband that does not overlap both the first passband and the second passband.

2. The multiplexer according to claim 1,
   wherein when the first filter and the second filter are viewed from the common terminal in a state in which the first filter and the second filter are connected to the common terminal and the third filter is disconnected from the common terminal, an impedance in the first passband, an impedance in the second passband, and an impedance in the third passband are located in one of an inductive region and a capacitive region in a Smith chart, and
   when the third filter is viewed from the common terminal in a state in which the first filter and the second filter are disconnected from the common terminal and the third filter is connected to the common terminal, an impedance in the first passband, an impedance in the second passband, and an impedance in the third passband are located in another of the inductive region and the capacitive region in a Smith chart.

3. The multiplexer according to claim 1,
wherein the common terminal and the first filter are connected without a switch provided therebetween, and the common terminal and the second filter are connected without a switch provided therebetween.

4. The multiplexer according to claim 1,
wherein at least one of the first filter or the second filter is connected to the common terminal via a switch.

5. The multiplexer according to claim 1,
wherein the common terminal and the third filter are connected without a switch provided therebetween.

6. The multiplexer according to claim 1, further comprising:
a fourth filter configured to be connected to the common terminal, and having a fourth passband that does not overlap all of the first passband, the second passband, and the third passband.

7. The multiplexer according to claim 1,
wherein a radio frequency signal used in a fourth generation mobile communication system (4G) passes through the first filter, and
a radio frequency signal used in a fifth generation mobile communication system (5G) passes through the second filter.

8. The multiplexer according to claim 1,
wherein a radio frequency signal used in a fourth generation mobile communication system (4G) passes through the first filter, and
a radio frequency signal used in a wireless local area network (WLAN) passes through the second filter.

9. The multiplexer according to claim 1,
wherein a radio frequency signal used in a wireless local area network (WLAN) passes through the first filter, and
a radio frequency signal used in a fifth generation mobile communication system (5G) passes through the second filter.

10. The multiplexer according to claim 7,
wherein the first passband is Band 20 for Evolved Universal Terrestrial Radio Access (E-UTRA),
the second passband is n28 for New Radio (NR), and
the third passband is Band 5 for E-UTRA.

11. The multiplexer according to claim 7,
wherein the first passband is Band 3 for Evolved Universal Terrestrial Radio Access (E-UTRA),
the second passband is n3 for New Radio (NR), and
the third passband is Band 41 for E-UTRA.

12. A communication device, comprising:
a radio frequency (RF) signal processing circuit configured to process a radio frequency signal transmitted by an antenna and a radio frequency signal received by the antenna; and
the multiplexer according to claim 1 configured to transfer the radio frequency signals between the antenna and the RF signal processing circuit.

13. The communication device according to claim 12,
wherein the common terminal is connected to the antenna,
a first terminal of the first filter, a first terminal of the second filter, and a first terminal of the third filter are connected to the common terminal,
the communication device, further comprising:
a first low noise amplifier configured to be connected to a second terminal of the first filter, and to amplify a radio frequency signal having a frequency range in the first passband;
a second low noise amplifier configured to be connected to a second terminal of the second filter, and to amplify a radio frequency signal having a frequency range in the second passband; and
a third low noise amplifier configured to be connected to a second terminal of the third filter, and to amplify a radio frequency signal having a frequency range in the third passband.

14. The communication device according to claim 12,
wherein a first terminal of the first filter, a first terminal of the second filter, and a first terminal of the third filter are connected to the common terminal,
the communication device, further comprising:
a fourth low noise amplifier that includes an output terminal connected to the common terminal, and is configured to amplify a radio frequency signal having a frequency range in the first passband, a radio frequency signal having a frequency range in the second passband, and a radio frequency signal having a frequency range in the third passband;
a first low noise amplifier configured to be connected to a second terminal of the first filter, and to amplify a radio frequency signal having the frequency range in the first passband;
a second low noise amplifier configured to be connected to a second terminal of the second filter, and to amplify a radio frequency signal having the frequency range in the first passband; and
a third low noise amplifier configured to be connected to a second terminal of the third filter, and to amplify a radio frequency signal having the frequency range in the first passband.

15. The communication device according to claim 12, further comprising:
a fifth low noise amplifier configured to amplify a radio frequency signal having a frequency range in the first passband, a radio frequency signal having a frequency range in the second passband, and a radio frequency signal having a frequency range in the third passband, the radio frequency signals being received by the antenna,
wherein the common terminal is connected to an output terminal of the fifth low noise amplifier,
a first terminal of the first filter, a first terminal of the second filter, and a first terminal of the third filter are connected to the common terminal, and
a second terminal of the first filter, a second terminal of the second filter, and a second terminal of the third filter are connected to the RF signal processing circuit.

* * * * *